United States Patent [19]
Childs et al.

[11] Patent Number: 5,384,737
[45] Date of Patent: Jan. 24, 1995

[54] PIPELINED MEMORY HAVING SYNCHRONOUS AND ASYNCHRONOUS OPERATING MODES

[75] Inventors: Lawrence F. Childs; Kenneth W. Jones; Stephen T. Flannagan; Ray Chang, all of Austin, Tex.

[73] Assignee: Motorola Inc., Schaumburg, Ill.

[21] Appl. No.: 207,509

[22] Filed: Mar. 8, 1994

[51] Int. Cl.⁶ .............................................. G11C 13/00
[52] U.S. Cl. .................... 365/189.05; 365/189.04; 365/230.08
[58] Field of Search ............... 365/189.01, 189.05, 365/189.03, 189.04, 230.08, 230.05, 190

[56] References Cited

U.S. PATENT DOCUMENTS

| | | | |
|---|---|---|---|
| 4,899,317 | 2/1990 | Hoekstra | 365/190 |
| 5,018,111 | 5/1991 | Madland | 365/233 |
| 5,105,108 | 4/1992 | Ngo | 307/603 |
| 5,111,455 | 5/1992 | Negus | 370/112 |
| 5,121,015 | 6/1992 | Ngo | 307/605 |
| 5,124,589 | 6/1992 | Shiomi et al. | 307/465 |
| 5,155,703 | 10/1992 | Nogle | 365/190 |
| 5,223,755 | 6/1993 | Richley | 307/603 |

OTHER PUBLICATIONS

Terry I. Chappell et al., "A 2ns Cycle, 4ns Access 512kb CMOS ECL SRAM", Feb. 1991 IEEE International Solid-State Circuits Conference, pp. 50, 51 & 288.

*Primary Examiner*—Terrell W. Fears
*Attorney, Agent, or Firm*—Daniel D. Hill

[57] ABSTRACT

A pipelined memory (20) has a synchronous operating mode and an asynchronous operating mode. The memory (20) includes output registers (34) and output enable registers (48) which are used to electrically switch between the asynchronous operating mode and the synchronous operating mode. In addition, in the synchronous operating mode, the depth of pipelining can be changed between a three stage pipeline and a two stage pipeline. By changing the depth of pipelining, the memory (20) can operate using a greater range of clock frequencies. In addition, the operating frequency can be changed to facilitate testing and debugging of the memory (20).

20 Claims, 18 Drawing Sheets

PIPELINED MEMORY HAVING SYNCHRONOUS AND ASYNCHRONOUS OPERATING MODES

CROSS REFERENCE TO RELATED APPLICATIONS

1. A related application entitled "Delay Locked Loop For Detecting the Phase Difference of Two Signals Having Different Frequencies", by Chang et al., and having Attorney Docket Number SC02252A, was filed concurrently herewith, and assigned to the assignee hereof.

2. A related application entitled "Write Control For A Memory Using A Delay Locked Loop", by Flannagan et al., and having Attorney Docket Number SC02249A, was filed concurrently herewith, and assigned to the assignee hereof.

3. A related application entitled "Synchronous Memory Having Parallel Output Data Paths", by Flannagan et al., and having Attorney Docket Number SC02226A, was filed concurrently herewith, and assigned to the assignee hereof.

4. A related application entitled "Memory Having Bit Line Load With Automatic Bit Line Precharge And Equalization", by Flannagan et al., and having Attorney Docket Number SC02376A, was filed concurrently herewith, and assigned to the assignee hereof.

FIELD OF THE INVENTION

This invention relates generally to memories, and more particularly, to a pipelined memory having synchronous and asynchronous operating modes.

BACKGROUND OF THE INVENTION

In integrated circuit memories, there are various ways of controlling the flow of data into and out of the memory. For example, a static random access memory (SRAM) may be operated asynchronously or synchronously. In an asynchronous SRAM, timing for controlling the RAM is accomplished using external logic.

A synchronous (SRAM) is a type of memory that has latches for all inputs and outputs, good drive capability, and a self timed write cycle, all on a single monolithic integrated circuit. A synchronous SRAM is typically used as a high speed cache in a data processing system. When being used as a cache, the synchronous SRAM is under the control of a single system clock. The synchronous SRAM can also be pipelined.

The synchronous SRAM has several advantages over an asynchronous SRAM. First, the synchronous SRAM generally requires fewer external logic chips. Second, the synchronous SRAM can operate at higher system speeds than a comparable asynchronous memory. However, as the synchronous SRAM is required to operate at higher system clock frequencies, timing specifications become increasingly more difficult to meet. For example, it becomes more difficult to test and debug the high speed synchronous SRAM using existing testing equipment. Also, the synchronous SRAM has a relatively small range of clock frequencies at which it can be operated, which prevents the speed of the memory from being reduced for testing and debugging purposes. In addition, manufacturing yields are reduced, and costs increased, because process, power supply, and temperature variations have more effect on the narrow margins that result from reduced cycle times.

SUMMARY OF THE INVENTION

Accordingly, there is provided, in one form, a pipelined integrated circuit memory, having a plurality of memory cells, a column decoding circuit, an output register, and an output enable circuit. A memory cell of the plurality of memory cells is coupled to a bit line pair and to a word line. The column decoding circuit is coupled to the plurality of memory cells, and provides a data signal corresponding to data stored in a selected memory cell during a read cycle of the memory. The output register has an input terminal coupled to the column decoding circuit, and an output terminal. The output register receives the data signal from the column decoding circuit, and is responsive to a first clock signal. The output enable circuit is coupled to the output register and delays the data signal for three clock cycles of the first clock signal during operation of the pipelined integrated circuit in a three-stage pipelining mode. The output enable circuit delays the output data for two clock cycles of the first clock signal during operation of the pipelined integrated circuit memory in a two-stage pipelining mode. These and other features and advantages will be more clearly understood from the following detailed description taken in conjunction with the accompanying drawings.

DESCRIPTION OF A PREFERRED EMBODIMENT

Figure 1:
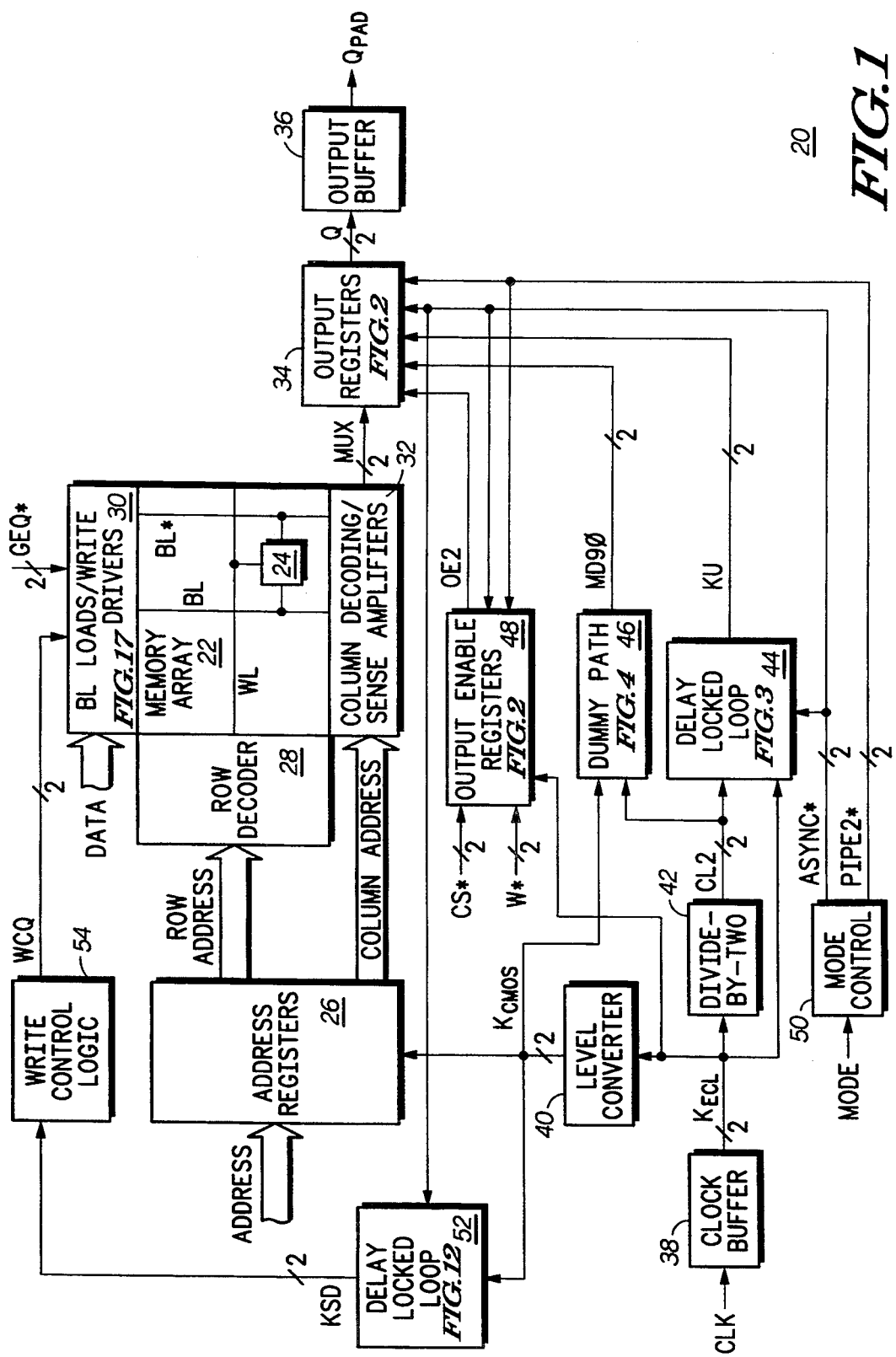
FIG. 1 illustrates in block diagram form, a memory in accordance with the present invention.

FIG. 1 illustrates in block diagram form, memory 20 in accordance with the present invention. Memory 20 includes memory array 22, bit line loads/write drivers 30, address registers 26, row decoders 28, column decoding/sense amplifiers 32, output registers 34, output buffer 36, clock buffer 38, level converter 40, divide-by-two circuit 42, read control delay locked loop circuit 44, dummy path 46, output enable registers 48, write control delay locked loop circuit 52, and write control logic 54.

Figure 2:
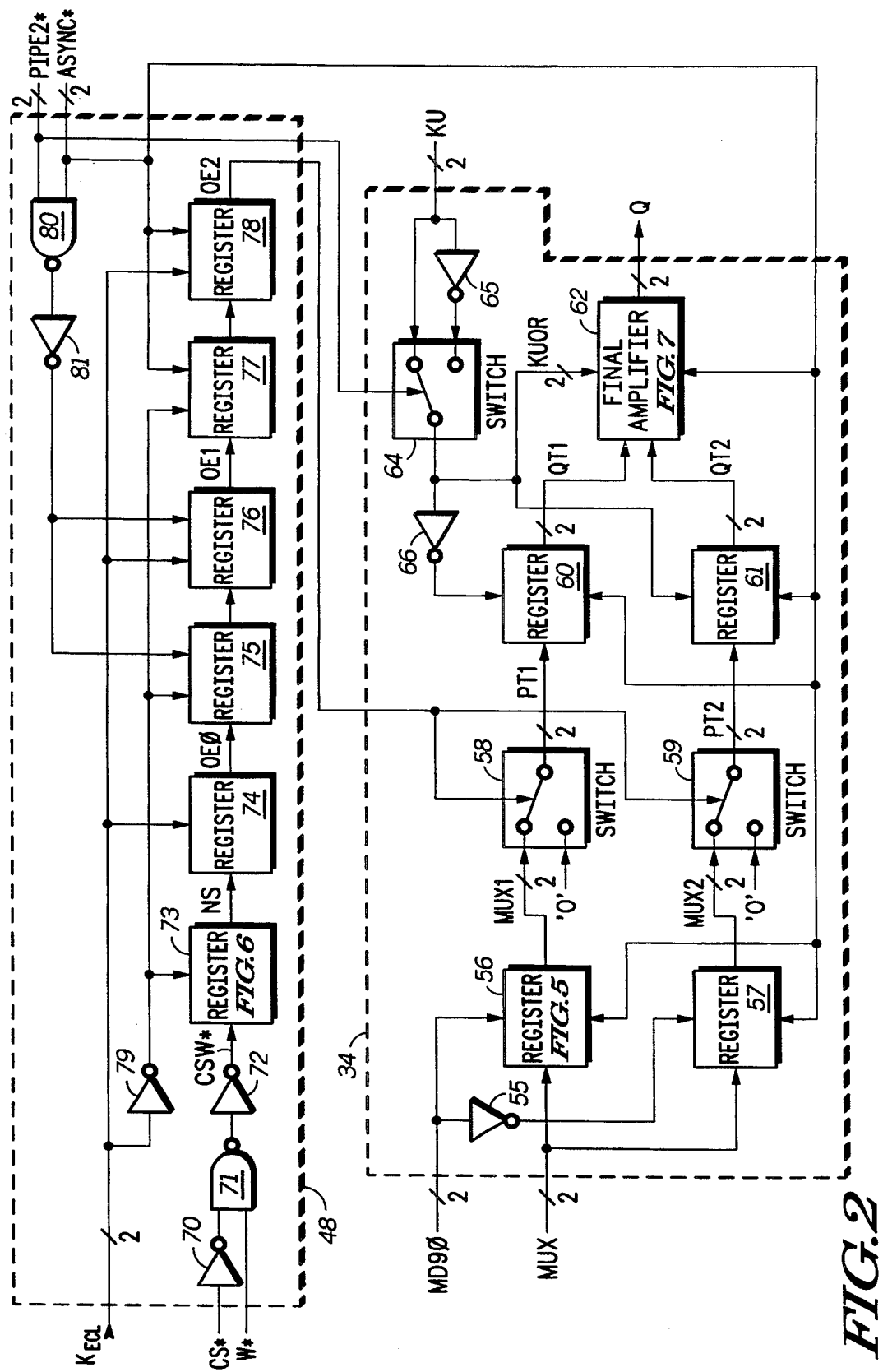
FIG. 2 illustrates in partial block diagram form and partial logic diagram form, a portion of the memory of FIG. 1.

Memory array 22 includes a plurality of static random access memory cells. Each memory cell is coupled to a word line and a bit line pair. Each bit line pair serves as an input to the memory cells during a write cycle of memory 20 and as an output during a read cycle. A representative memory cell 24 is shown coupled to a word line labeled "WL", and to a pair of bit lines labeled "BL" and "BL*". Note that an asterisk "*" after a signal name indicates that the signal is a logical complement of a signal having the same name but lacking the asterisk "*". If the logically true state of a signal is a digital logic level one, the logically complement state is a digital logic level zero. And if the logically true state of a signal is a digital logic level zero, the logically complement state is a digital logic level one. Also note that the signals shown in FIG. 1 and FIG. 2 are differential signals, only the logically true signal name is used to indicate which signal is the logically true signal.

Address registers 26 receive ECL level address signals labeled "ADDRESS", and provide row address signals labeled "ROW ADDRESS" to row decoders 28, and column address signals labeled "COLUMN ADDRESS" to column decoding/sense amplifiers 32. Note that the particular address signals have no special significance and may be different in other embodiments. Also, the amount of decoding performed by the row and column decoders may be different in other embodiments.

Data input buffers (not shown) provide input data signals labeled "DATA" to bit line loads/write drivers 30. Bit line loads/write drivers 30 receive input data signals DATA, a write control signal labeled "WCQ", and a global equalization signal labeled "GEQ", and are coupled to each bit line pair of memory array 22.

Clock buffer 38 receives an external ECL clock signal labeled "CLK", and provides a buffered clock signal labeled "$K_{ECL}$". Divide-by-two circuit 42 receives buffered clock signal $K_{ECL}$ and provides a clock signal labeled "CL2" at one-half the frequency of clock signal $K_{ECL}$. Level converter circuit 40 also receives clock signal $K_{ECL}$ and provides a CMOS (complementary metal-oxide semiconductor) level clock signal labeled "$K_{CMOS}$". Clock signal $K_{CMOS}$ is provided to write control delay locked loop 52, dummy path 46, and address registers 26. Read control delay locked loop circuit 44 receives clock signal CL2, clock signal $K_{ECL}$, and a mode control signal labeled "ASYNC*", and in response, provides a clock signal labeled "KU". Read control delay locked loop circuit 44 is illustrated in more detail in FIG. 3. Dummy path 46 receives clock signal CL2, and in response, provides a clock signal labeled "MD90". Dummy path 46 is illustrated in more detail in FIG. 4. Output enable registers 48 receives clock signal $K_{ECL}$, a chip select signal labeled "CS*", a write enable signal labeled "W*", mode control signal ASYNC*, a pipelining control signal labeled "PIPE2*", and in response, provides an output enable signal labeled "OE2". Output enable registers 48 are provided in more detail in FIG. 2. Output registers 34 receives data signal MUX, output enable signal OE2, clock signals KU and MD90, mode control signal ASYNC*, pipelining control signal PIPE2*, and in response, provides data signal Q. Output registers 34 are provided in more detail in FIG. 2. Mode control circuit 50 receives an external mode control signal labeled "MODE", and in response, provides mode control signal ASYNC* and pipeline control signal PIPE2*. Write control delay locked loop circuit 52 receives clock signal KCMOS, mode control signal ASYNC*, and in response, provides a clock signal labeled "KSD".

During a read cycle of memory 20, column address signals COLUMN ADDRESS are provided to column decoding/sense amplifiers 32 to select a column. Row address signals ROW ADDRESS are provided to row decoders 28 to select a word line. Memory cells located on the enabled word line provide data to their respective bit line pairs. A data signal labeled "MUX", corresponding to data provided by a bit line pair, is provided by column decoding/sense amplifiers 32. The sense amplifiers sense and amplify the relatively small signals received from a selected bit line pair, and provide a data signal labeled "MUX" to output registers 34. Output registers 34 then provide a data signal labeled "Q" to output buffer 36. Output buffer 36 then provides an output data signal labeled "$Q_{PAD}$" to an output pad (not shown). Note that for the purpose of illustration, only one output data path for one data signal is illustrated in the embodiment of FIG. 1. In other embodiments, additional data paths may be used. Note that the number of data signals and address signals provided to, or received from memory 20 have no special significance and may be different in other embodiments.

During a write cycle, the flow of data is essentially reversed. To write data to memory 20, row decoders 28 receives row address signals ROW ADDRESS to select a word line. Column address signals COLUMN ADDRESS are provided to column decoding/sense amplifiers 32. Column decoding/sense amplifiers 32 are coupled to each bit line pair. Each memory cell of memory array 22 that is coupled to the selected word line receives a differential voltage on a corresponding bit line pair. As in the read cycle, memory cells located on an enabled word line provide data to bit line pairs. However, a voltage differential driven onto the bit line pairs by bit line loads/write drivers 30 is greater than the drive voltage of the memory cell and overwrites a stored bit in the memory cell. At the end of the write cycle the differential voltage on the bit line pair is reduced to a level small enough so that the data is not erroneously written into a memory cell during the following read cycle. Equalization of the bit line pairs is achieved by bit line loads/write drivers 30. The bit line loads are illustrated later in more detail in FIG. 17, and are used to reduce, or equalize, a differential voltage on the bit line pairs following a write cycle of memory 20. Equalization of the bit line pairs following a write cycle is commonly known as "write recovery".

FIG. 2 illustrates in partial block diagram form and partial logic diagram form, output registers 34 and output enable registers 48. Output registers 34 includes registers 56, 57, 60, and 61, switches 58, 59, and 64, and inverters 55, 65, and 66. Inverter 55 has an input terminal for receiving clock signal MD90, and an output terminal. Register 56 has an input terminal for receiving data signal MUX, a first control terminal for receiving clock signal MD90, a second control terminal for receiving mode control signal ASYNC*, and an output terminal for providing a data signal labeled "MUX1". Register 57 has an input terminal for receiving data signal MUX, a first control terminal connected to the output terminal of inverter 55, a second control terminal for receiving mode control signal ASYNC*, and an output terminal for providing a data signal labeled "MUX2". Switch 58 has a first input terminal connected to the output terminal of register 56 for receiving data signal MUX1, a second input terminal for receiving a reset logic value labeled '0', a control terminal for receiving output enable signal OE2, and an output terminal for providing a data signal labeled "PT1". Switch 59 has a first input terminal connected to the output terminal of register 57 for receiving data signal MUX2, a second input terminal for receiving reset logic value '0', and an output terminal for providing a data signal labeled "PT2". Register 60 has an input terminal connected to the output terminal of switch 58 for receiving data signal PT1, a first control terminal, a second control terminal for receiving mode control signal ASYNC*, and an output terminal for providing a data signal labeled "QT1". Register 61 has an input terminal connected to the output terminal of switch 59 for receiving data signal PT2, a first control terminal, a second control terminal for receiving mode control signal ASYNC*, and an output terminal for providing a data signal labeled "QT2". Final amplifier 62 has a first input terminal connected to the output terminal of register 60 for receiving data signal QT1, a second input terminal connected to the output terminal of register 61 for receiving data signal QT2, a first control terminal, a second control terminal for receiving mode control signal ASYNC*, and an output terminal for providing data signal Q. Inverter 65 has an input terminal for receiving delayed clock signal KU, and an output terminal. Switch 64 has a first input terminal for receiving delayed clock signal KU, a second input terminal connected to the output terminal of inverter 65, a control terminal for receiving pipeline control signal PIPE2*, and an output terminal connected to the first control terminals of register 61 and final amplifier 62. Inverter 66 has an input terminal connected to the output terminal of switch 64, and an output terminal connected to the first control terminal of register 60.

Output enable registers 48 includes inverters 70, 72, 79, and 81, NAND logic gate 71, and registers 73-78. Inverter 70 has an input terminal for receiving chip select signal CS*, and an output terminal. NAND logic gate 71 has a first input terminal connected to the output terminal of inverter 70, a second input terminal for receiving write enable signal W*, and an output terminal. Inverter 72 has an input terminal connected to the output terminal of NAND gate 71, and an output terminal for providing a control signal labeled "CSW*". Inverter 79 has an input terminal for receiving clock signal $K_{ECL}$, and an output terminal. NAND logic gate 80 has a first input terminal for receiving pipeline control signal PIPE2*, a second input terminal for receiving mode control signal ASYNC*, and an output terminal. Inverter 81 has an input terminal connected to the output terminal of NAND logic gate 80, and an output terminal. Register 73 has an input terminal connected to the output terminal of inverter 72, a control terminal connected to the output terminal of inverter 79, and an output terminal for providing a signal labeled "NS". Register 74 has an input terminal connected to the output terminal of register 73, a control terminal for receiving clock signal $K_{CMOS}$, and an output terminal. Register 75 has an input terminal connected to the output terminal of register 74, a first control terminal connected to the output terminal of inverter 79, a second control terminal connected to the output terminal of inverter 81, and an output terminal for providing a signal labeled "OE0". Register 76 has an input terminal connected to the output terminal of register 75, a first control terminal for receiving clock signal $K_{CMOS}$, a second control terminal connected to the output terminal of inverter 81, and an output terminal for providing a signal labeled "OE1". Register 77 has an input terminal connected to the output terminal of register 76, a first control terminal connected to the output terminal of inverter 79, a second control terminal for receiving mode control signal ASYNC*, and an output terminal. Register 78 has an input terminal connected to the output terminal of register 77, a first control terminal for receiving clock signal $K_{CMOS}$, a second control terminal for receiving mode control signal ASYNC*, and an output terminal for providing output enable signal OE2.

Output registers 34 have two parallel, interleaved, output data paths. One output data path is through register 56, switch 58, and register 60 to final amplifier 62. The other output data path is through register 57, switch 59 and register 61 to final amplifier 62. The parallel data paths are controlled by clock signal MD90, and delayed clock signal KU. Output enable registers 48 provides output enable signal to switches 58 and 59 during a write cycle of memory 20. When clock signal MD90 is a logic high, data signal MUX is sent through register 56 as data signal MUX1, while the data in the other output data path is latched by register 57. When clock signal MD90 is low, data signal MUX, which was held in register 57 during the previous clock cycle, is sent through register 57 as corresponding data signal MUX2, while the next data signal MUX is latched in register 56.

Figure 18:
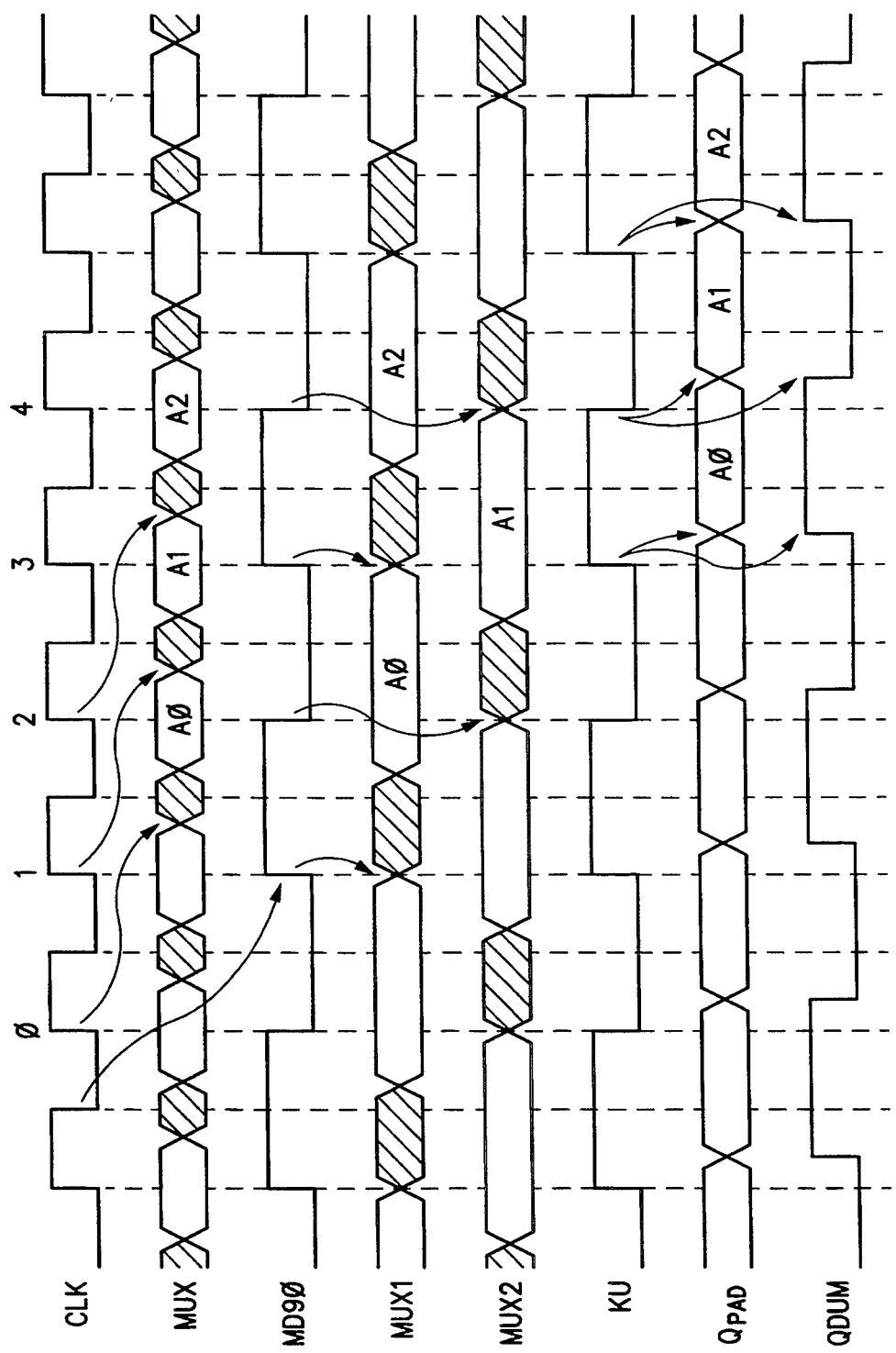
FIG. 18 illustrates a timing diagram of various signals of the memory of FIG. 1 in three stage pipeline mode.
Figure 19:
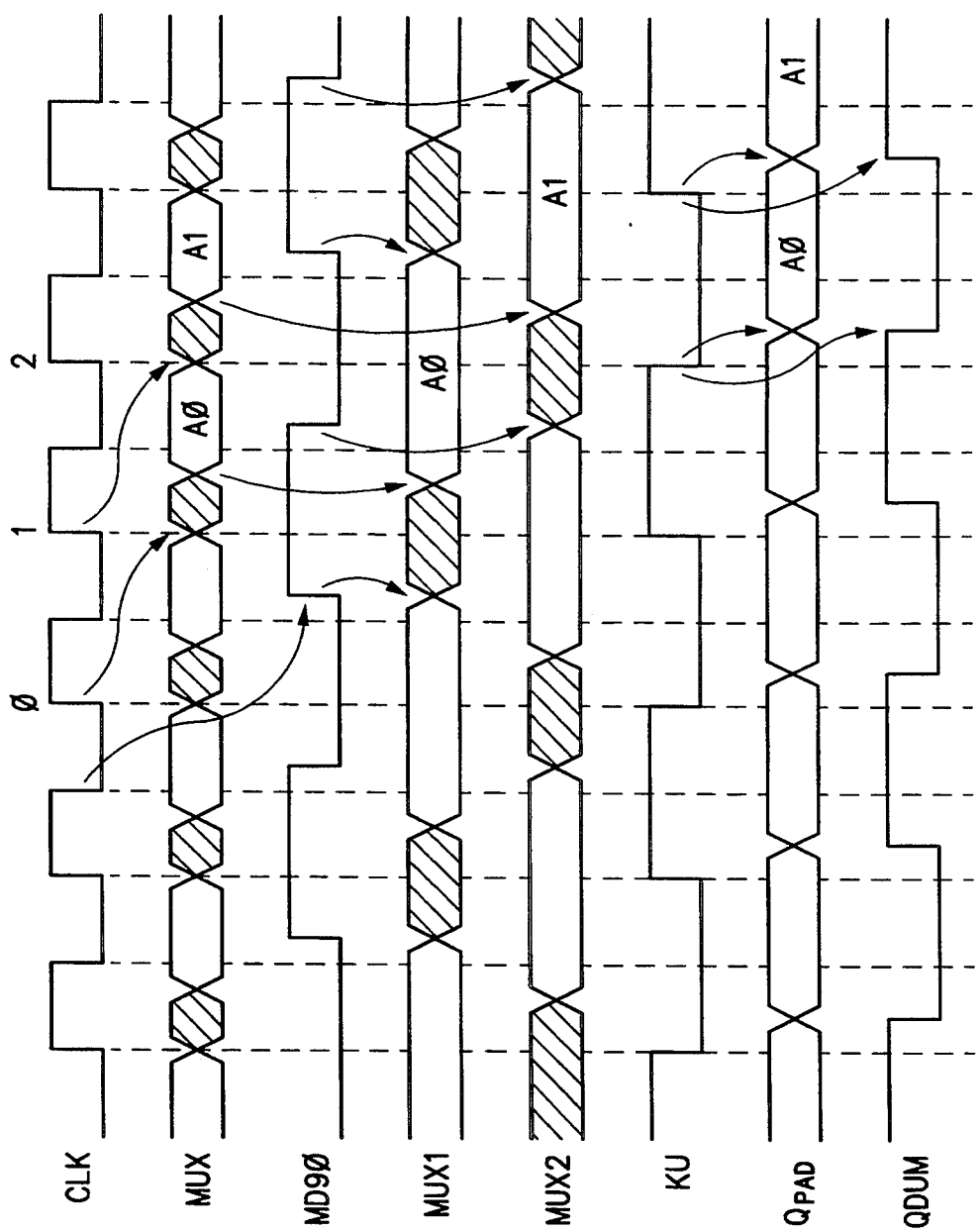
FIG. 19 illustrates a timing diagram of various signals of the memory of FIG. 1 in two stage pipeline mode.

Clock signal MD90 is generated from the falling edge of clock signal CLK, whereas the data signal MUX is generated from the rising edge of CLK (see FIGS. 18 and 19). There is an inherent propagation delay associated with accessing a memory during a read or a write cycle. In memory 20, a delay, measured from the time an address is provided to address registers 26 to the time data signal MUX reaches output registers 34, is duplicated by dummy path 46 during a read cycle. In other words, dummy path 46 has various elements to track the propagation delay of memory 20, and provide clock signal MD90 after a delay equal to the propagation delay of memory 20. Because clock signal MD90 tracks the propagation delay of memory 20, MD90 switches in the middle of the data valid window of data signal MUX. (See FIG. 18 and FIG. 19.)

By using parallel data output paths, the validity period of data signals MUX1 and MUX2 are greater than the validity period of data signal MUX. During a read cycle, output enable signal OE2 is a logic high, so that data signals MUX1 and MUX2 will be provided to registers 60 and 61, respectively. Data signals MUX1 and MUX2 are changing only half as often as data signal MUX. Since the clock signal MD90 is correlated to the propagation delay of memory 20 by dummy path 46, clock signal MD90 tracks data signal MUX in terms of process, supply, or temperature variations. Another advantage of using parallel data paths controlled by a dummy path is that if the frequency of clock signal CLK decreases, clock signal MD90 continues to match the propagation delay of memory 20, thereby staying within the data valid window.

Delayed clock signal KU controls the operation of registers 60 and 61. When pipelining control signal PIPE2* is a logic high, clock signal KUOR is the same logic state as delayed clock signal KU. When clock signal KUOR is a logic low, data signal PT1 is sent through register 60 to become corresponding data signal QT1, while data signal QT2 is latched by register 61. Also, while clock signal KUOR is a logic low, data signal QT2 is provided as output data signal Q by final amplifier 62. While clock signal KUOR is a logic high, data signal PT2 is sent through register 61 to become corresponding data signal QT2, while data signal QT1 is latched by register 60. Also, data signal QT1 is provided as output data signal Q through final amplifier 62. (See FIG. 18 and FIG. 19)

Delayed clock signal KU occurs slightly before the rising edge of clock signal CLK, so that output data signal Q will change at the same time as the rising edge of clock signal CLK. Delayed clock signal KU is provided by read control delay locked loop 44, which will be described later.

Memory 20 has a three-stage pipeline, that is, output data signal Q corresponds to data located at an address which was accessed three clock cycles prior to receiving output data signal Q. With reference to FIG. 18, note that the rising edge of delayed clock signal KU acquires data corresponding to address A0. On the falling edge of delayed clock signal KU, data corresponding to address A1 is acquired. Using parallel data registers reduces the possibility that wrong data will be acquired during high speed operation by widening the data valid window.

To operate memory 20 at slower clock frequencies than normal, memory 20 can be changed from a three-stage pipeline operating mode to a two-stage pipeline operating mode. This is accomplished in output registers 34 by reversing the polarity of clock signal KUOR. When pipelining control signal PIPE2* is a logic low, delayed clock signal KU is inverted before being provided to output registers 34. Thus, clock signal KUOR is the logical complement of delayed clock signal KU. A timing diagram of the two-stage pipeline mode of operation is illustrated in FIG. 19. Note that the falling edge of delayed clock signal KU acquires data corresponding to address A0, instead of the rising edge of delayed clock signal KU as was the case in the three-stage pipeline mode. In the two-stage pipeline mode, output data is received by final amplifier 62 two clock cycles after an address is provided to address registers 26. Since data is being acquired by an earlier edge of delayed clock signal KU, the clock cycle time can be slower than in the three-stage pipeline mode.

If output enable signal OE2 is a logic low, then logic low data signals PT1 and PT2 are provided to the output terminal of final amplifier 62. In three-stage pipeline mode, if write enable signal W* is a logic low, or chip select signal CS* signal is a logic high, then the output terminal of final amplifier 62 becomes a logic low three cycles later after output enable signal OE2 becomes a logic low. In two-stage pipeline mode, the output terminal of final amplifier 62 becomes a logic low two cycles later.

Output enable signal OE2 is generated by output enable registers 48. Registers 73 and 74 are two phase clock registers that acquire and latch the logic state of control signal CSW*. Register 73 is illustrated in more detail in FIG. 6. Registers 75 and 76 register control signal CSW* for one clock cycle, and registers 77 and 78 register control signal CSW* for another clock cycle. In the three-stage pipeline mode, output enable signal OE2 has the same logic state as control signal CSW*, registered for two clock cycles, and then provided to output registers 34. In the two-stage pipeline mode, the logic state of output enable signal OE2 is equal to the logic state of control signal CSW*, registered for only one cycle. For operation in the two-stage pipeline mode, registers 75 and 76 are placed in a flow through mode. Registers 75 and 76 are similar to output register 56 illustrated in FIG. 5.

In the asynchronous mode, output data is generated directly from clock signal CLK. Clock signals MD90 and KU, are ignored. The asynchronous mode is accomplished by adding a flow through mode to output register 34. Registers 56, 57, 60, and 61 and final amplifier 62 receive mode control signal ASYNC* to provide the flow through mode. When mode control signal ASYNC* is a logic low, data passes through output registers 34 regardless of the state of the clock signals. Mode control signal ASYNC* is also used to provided a flow through mode for output enable registers 48. When mode control signal ASYNC* is a logic low, registers 75, 76, 77, and 78 are in flow through mode. An advantage of this method of mode control is that it is accomplished electrically, allowing memory 20 to operate in either mode by changing the logic state of an external input signal, instead of by changing a metal layer, or some other manufacturing change.

Note that output registers 34 have two parallel data paths in the illustrated embodiments. However, in other embodiments, more output data paths may be used. The benefit of using more parallel paths is that the internal parallel registration path will change even less frequently, allowing for an even slower clock cycle before the maximum clock cycle is reached, and providing an even wider data valid window. Parallel output data registers can be used with any type of synchronous memory, such as SRAM or DRAM (dynamic random access memory).

Figure 3:
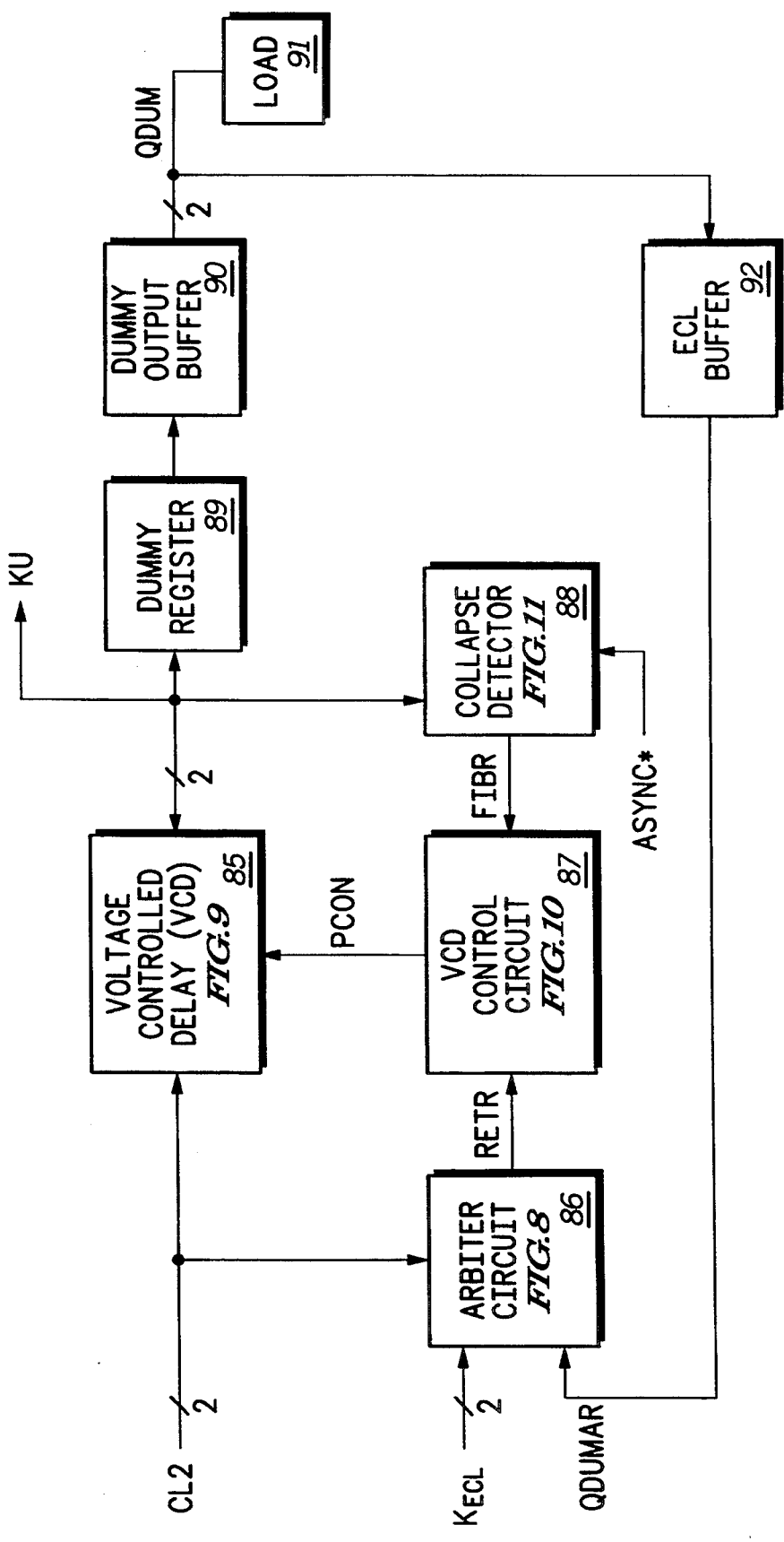
FIG. 3 illustrates in block diagram form, the read control delay locked loop of FIG. 1.

FIG. 3 illustrates in block diagram form, read control delay locked loop 44. Read control delay locked loop 44 includes voltage controlled delay (VCD) 85, arbiter circuit 86, VCD control circuit 87, collapse detector 88, dummy register 89, dummy output buffer 90, load 91, and ECL buffer circuit 92. Voltage controlled delay 85 receives clock signal CL2, a control voltage labeled "PCON", and in response, provides clock signal KU at an output terminal. Arbiter circuit 86 receives clock signals $K_{ECL}$ and CL2, a dummy output signal labeled "QDUMAR", and in response, provides a retard signal "RETR" at an output terminal. VCD control circuit 87 has an input terminal connected to the output terminal of arbiter circuit 86, an input terminal, and an output terminal for providing control voltage PCON. Collapse detector 88 has an input terminal connected to the output terminal of voltage control delay 85, a control terminal for receiving mode control signal ASYNC*, and an output terminal for providing a collapse detector output signal labeled "FIBR". Dummy register 89 has an input terminal connected to the output terminal of voltage controlled delay 85, and an output terminal. Dummy output buffer 90 has an input terminal connected to the output terminal of dummy register 89, and an output terminal for providing a dummy output signal labeled "QDUM". Load 91 is connected to the output terminal of dummy output buffer 90. ECL buffer circuit 92 has an input terminal connected to the output terminal of dummy output buffer 90, and an output terminal connected to the second input terminal of arbiter 86.

Note that the signals in delay locked loop 44 are either "small-signal" or ECL (emitter-coupled logic) level signals, and that clock signal CL2, clock signal $K_{ECL}$, dummy output signal QDUMAR, and delayed clock signal KU are all complementary signals.

In operation, arbiter circuit 86 determines which one of two signals, clock signal $K_{ECL}$ or dummy output signal QDUMAR is the first to change logic states. Arbiter circuit 86 is controlled by clock signal CL2. The frequency of clock signal CL2 is equal to one-half the frequency of clock signal CLK. Clock signal CLK is used to enable or "unmask" arbiter circuit 86 when clock signal CL2 is a logic low. When clock signal CL2 is a logic high, arbiter circuit 86 is disabled, or "masked", and ignores both input signals ($K_{ECL}$ and QDUMAR). Controlling arbiter circuit 86 with clock signal CL2 allows delay locked loop 44 to phase-lock two signals having different frequencies. This is an advantage over the prior art where a conventional delay locked loop can only phase-lock two signals having the same frequencies.

In the illustrated application for arbiter circuit 86, dummy output signal QDUMAR is one-half the frequency of clock signal $K_{ECL}$. By enabling, or unmasking arbiter 86 during the first half of a cycle of clock signal CL2, and then disabling arbiter 86 on the other half, arbiter 86 does not inadvertently lock onto the wrong signal edge when a signal having a higher frequency over runs a signal having a slower frequency. When arbiter circuit 86 has determined which signal switches early, it provides retard signal RETR to VCD control circuit 87. For example, if the cross point of dummy output signal QDUMAR (remember that the dummy output signal QDUMAR is a complementary signal) happens before the cross point of clock signal $K_{ECL}$ then retard signal RETR is provided as a logic high, but if the cross point of dummy output signal QDUMAR happens after the cross point of clock signal KECL, then retard signal RETL is provided as a logic low. VCD control circuit 87 then uses this information to increase or decrease control voltage PCON. If retard signal RETR is a logic high, which means that dummy output signal QDUMAR is too fast compared to clock signal $K_{ECL}$, then VCD control circuit 87 will decrease control voltage PCON toward $V_{SS}$ by a relatively small amount. This in turn will increase a propagation delay of delayed clock signal KU by VCD circuit 85. If retard signal RETR is a logic low, which means that dummy output signal QDUMAR is too slow compared to clock signal $K_{ECL}$, then VCD control circuit 87 will increase control voltage PCON toward $V_{DD}$ by a small amount. This in turn will decrease the propagation delay provided by VCD circuit 85.

Dummy register 89 and dummy output buffer 90 are used to track a delay from a rising and/or a falling edge of delayed clock signal KU to an edge of output signal $Q_{PAD}$. This delay indicates how early delayed clock signal KU should be generated relative to clock signal CLK.

Collapse detector 88 detects if VCD circuit 85 "collapses". VCD circuit 85 "collapses" when the propagation delay provided by VCD circuit 85 is too long. VCD circuit 85 may "collapse" when clock signals $K_{ECL}$ and CL2 are toggling, but the delayed clock signal KU does not have time to change its logic state in response. This may be caused by having too much capacitive loading at the internal nodes of VCD circuit 85. Consequently, arbiter circuit 86 will incorrectly determine that dummy output signal QDUMAR is too fast, and as a result, VCD control circuit 87 will try to slow dummy output signal QDUMAR by pulling control voltage PCON lower. However, in reality, dummy output signal QDUMAR is too slow and control voltage PCON should be pulled high toward $V_{DD}$. This situation may happen during power-up of memory 20. During power-up, the internal circuit nodes may be in an unknown state, and if the initial voltage of control voltage PCON is equal to $V_{SS}$, VCD circuit 85 may collapse.

Figure 4:
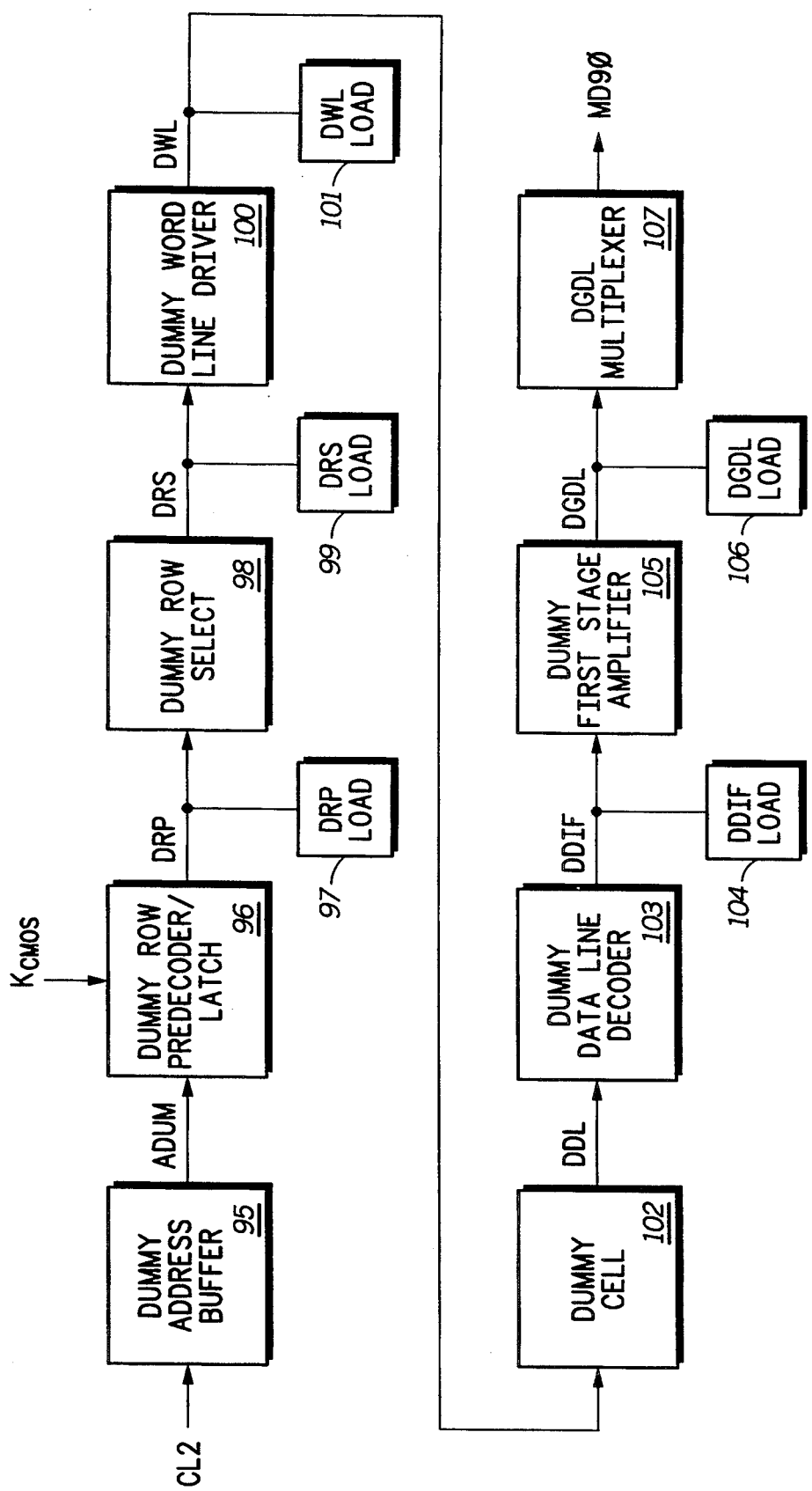
FIG. 4 illustrates in block diagram form, the dummy path of FIG. 1.

FIG. 4 illustrates in block diagram form, dummy path 46 of FIG. 1. Dummy path 46 includes series connected delay elements, each delay element for modeling a delay of memory 20 required for performing a function needed to access memory 20. Dummy path 46 includes dummy address buffer 95, dummy row predecoder/latch 96, DRP load 97, dummy row select 98, DRS load 99, dummy word line driver 100, DWL load 101, dummy cell 102, dummy data line decoder 103, DDIF load 104, dummy first stage amplifier 105, DGDL load 106, and DGDL multiplexer 107. Dummy address buffer 95 has an input terminal for receiving clock signal CL2, and an output terminal for providing a dummy address signal labeled "ADUM". Dummy row predecoder/latch has an input terminal connected to the output terminal of dummy address buffer 95, a control terminal for receiving clock signal $K_{CMOS}$, and an output terminal for providing a dummy row predecoder signal labeled "DRP". DRP load 97 has an input terminal connected to the output terminal of dummy row predecoder/latch 96. Dummy row select 98 has an input terminal connected to the output terminal of dummy row predecoder/latch 96, and an output terminal for providing a dummy row select signal labeled "DRS". DRS load 99 has an input terminal connected to the output terminal of dummy row select 98. Dummy word line driver 100 has an input terminal connected to the output terminal of dummy row select 98, and an output terminal for a providing dummy word line signal labeled "DWL". DWL load 101 has an input terminal connected to the output terminal of dummy word line driver 100. Dummy cell 102 has an input terminal connected to the output terminal of dummy word line driver 100, and an output terminal for providing a dummy data line signal labeled "DDL". Dummy data line decoder 103 has an input terminal connected to the output terminal of dummy cell 102, and an output terminal for providing a data line decoder signal labeled "DDIF". DDIF load 104 has an input terminal connected to the output terminal of dummy data line decoder 103. Dummy first stage amplifier 105 has an input terminal connected to the output terminal of dummy data line decoder 103, and an output terminal for providing a dummy first stage amplifier signal labeled "DGDL". DGDL load 106 has an input terminal connected to the output terminal of dummy first stage amplifier 105. DGDL multiplexer 107 has an input terminal connected to the output terminal of dummy first stage amplifier 105, and an output terminal for providing clock signal MD90.

Dummy path 46 contains scaled down versions, or models, of a delay path that occurs in memory 20. By using scaled down versions, metal loading and circuit loading is reduced, as are the sizes of the driving circuits themselves. Using scaled down versions also reduces surface area and power consumption of memory 20. The actual delay through dummy path 46 should be the same as through the SRAM. By using circuits similar to actual circuits used in memory 20, clock signal MD90 will more accurately track output data signal MUX in terms of process, power supply, and temperature variations.

Figure 5:
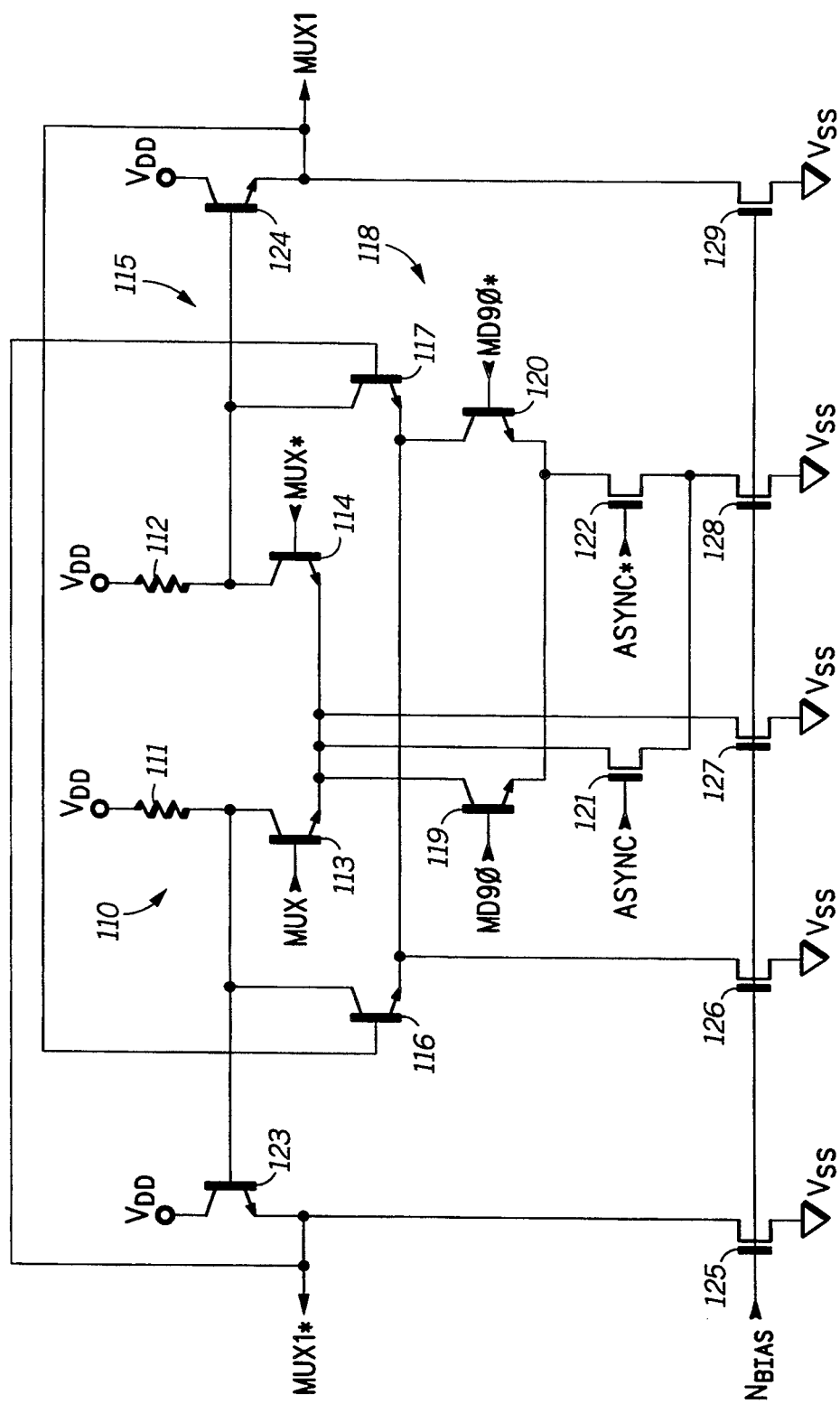
FIG. 5 illustrates in schematic diagram form, an output path register of FIG. 2

FIG. 5 illustrates in schematic diagram form, output register 56 of output registers 34 of FIG. 2. Output register 56 includes differential amplifier 110, differential pairs 115 and 118, N-channel transistors 121, 122, 125-129, and emitter-follower transistors 123 and 124. Differential amplifier 110 includes resistors 111 and 112, and NPN transistors 113 and 114. Differential pair 115 includes NPN transistors 116 and 117. Differential pair 118 includes NPN transistors 119 and 120.

Resistor 111 has a first terminal connected to a power supply voltage terminal labeled "$V_{DD}$", and a second terminal. Resistor 112 has a first terminal connected to power supply voltage terminal $V_{DD}$, and a second terminal. NPN transistor 113 has a collector connected to the second terminal of resistor 111, a base for receiving data MUX, and an emitter. NPN transistor 114 has a collector connected to the second terminal of resistor 112, a base for receiving data signal MUX*, and an emitter connected to the emitter of NPN transistor 113. NPN transistor 116 has a collector connected to the collector of NPN transistor 113, a base, and an emitter. NPN transistor 117 has a collector connected to the collector of NPN transistor 114, a base, and an emitter connected to the emitter of NPN transistor 116. NPN transistor 119 has a collector connected to the emitters of NPN transistors 113 and 114, a base for receiving clock signal MD90, and an emitter. NPN transistor 120 has a collector connected to the emitters of NPN transistors 116 and 117, a base for receiving clock signal MD90*, and an emitter connected to the emitter of NPN transistor 119. N-channel transistor 121 has a drain connected to the emitters of NPN transistors 113 and 114, a gate for receiving mode control signal ASYNC, and a source. N-channel transistor 122 has a drain connected to the emitter of NPN transistors 119 and 120, a gate for receiving mode control signal ASYNC*, and a source connected to the source of N-channel transistor 121. Emitter-follower transistor 123 has a collector connected to $V_{DD}$, a base connected to the collector of NPN transistor 113, and an emitter connected to the base of NPN transistor 117 for providing data signal MUX1*. Emitter-follower transistor 124 has a collector connected to $V_{DD}$, a base connected to the collector of NPN transistor 114, and an emitter connected to the base of NPN transistor 116 for providing data signal MUX1. N-channel transistor 125 has a drain connected to the emitter of emitter-follower transistor 123, a gate for receiving a bias voltage labeled $N_{BIAS}$, and a source connected to a power supply voltage terminal labeled "$V_{SS}$". N-channel transistor 126 has a drain connected to the emitters of NPN transistors 116 and 117, a gate for receiving bias voltage $N_{BIAS}$, and a source connected to $V_{SS}$. N-channel transistor 127 has a drain connected to the emitters of NPN transistors 113 and 114, a gate for receiving bias voltage $N_{BIAS}$, and a source connected to $V_{SS}$. N-channel transistor 128 has a drain connected to the sources of N-channel transistors 121 and 122, a gate for receiving bias voltage $N_{BIAS}$, and a source connected to $V_{SS}$. N-channel transistor 129 has a drain connected to the emitter of emitter-follower transistor 124, a gate for receiving bias voltage $N_{BIAS}$, and a source connected to $V_{SS}$.

In output register 56, either one of two differential pairs is selected, differential amplifier 110, or differential pair 115. Differential clock signals MD90/MD90* determine which differential pair is selected. If clock signal MD90 is a logic high and clock signal MD90* is a logic low, the logic state of differential data signals MUX/MUX* will control the current in resistors 111 and 112. If clock signal MD90* is higher than clock signal MD90, than the logic state of differential data signals MUX1/MUX1* will control the current in resistors 111 and 112. Current is steered through the transistor whose controlling input signal is a higher voltage. Differential mode control signals ASYNC/ASYNC* determine the operation of output register 56.

Output register 56 functions as a register when differential mode control signal ASYNC is a logic low and differential mode control signal ASYNC* is a logic high. When ASYNC is a logic low, N-channel transistor 121 is substantially non-conductive. Clock signal MD90 can then control the conductivity of NPN transistors 113 and 114, and clock signal MD90* can control the conductivity of differential pair 115. In the case when output register 56 is functioning as a register, clock signal MD90 is a logic high and clock signal MD90* is a logic low, differential data signals MUX/MUX* are provided to differential amplifier 110, current is steered through resistors 111 and 112 depending on the logic state of differential data signals MUX/MUX*. Differential output signals MUX1/MUX1* are provided at the emitters of emitter-follower transistors 124 and 123, respectively, corresponding to the logic states of differential data signals MUX/MUX*. When clock signal MD90 transitions to a logic low, and clock signal MD90* becomes a logic high. The logic state of MUX1/MUX1* is retained by differential pair 115 until clock signals MD90/MD90* change logic states again.

N-channel transistors 125-129 are used as current sources. N-channel transistors 125 and 129 provide current for emitter-follower transistors 123 and 124, respectively, N-channel transistor 128 supplies a current that is steered by the clock signals MD90/MD90*. N-channel transistors 126 and 127 are low current, voltage level "keepers", that prevent common emitter voltages of differential amplifier 110 and differential pair 115, respectively, from changing if the bases of NPN transistors 119 and 120 are not receiving clock signals MD90/MD90*.

Figure 6:
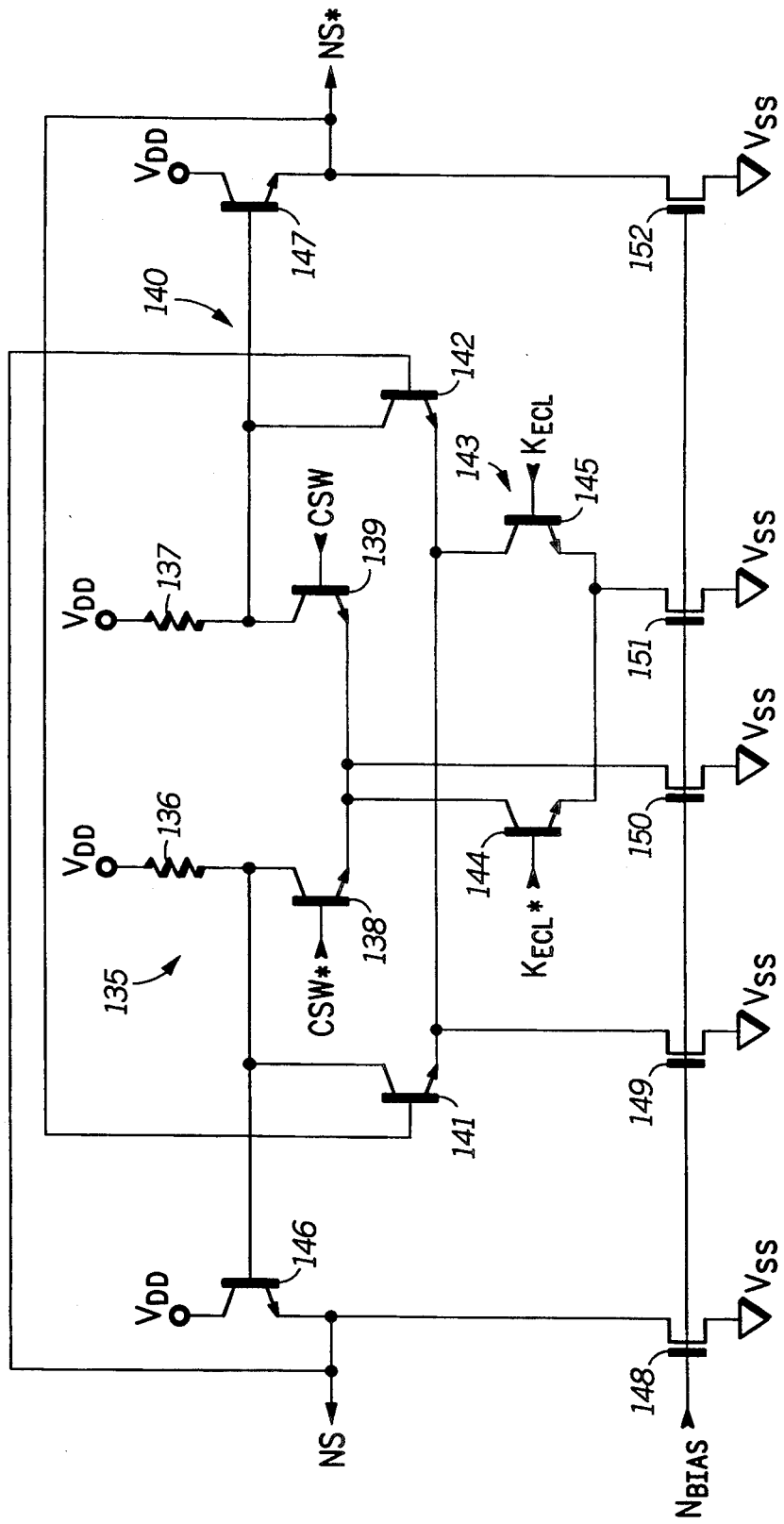
FIG. 6 illustrates in schematic diagram form, the output enable register of FIG. 2.

FIG. 6 illustrates in schematic diagram form, output enable register 73 of output enable registers 48 of FIG. 2. Output enable register 73 includes differential amplifier 135, differential pairs 140 and 143, emitter-follower transistors 146 and 147, N-channel transistors 148–152. Differential amplifier 135 includes resistors 136 and 137, and NPN transistors 138 and 139. Differential pair 140 includes NPN transistors 141 and 142. Differential pair 143 includes NPN transistors 144 and 145. Output enable register 73 receives differential control signals CSW/CSW*, and differential clock signals $K_{ECL}$/$K_{ECL}$*, and in response, provides control signal NS/NS*. Output enable register 73 is connected in essentially the same manner as output register 56, except that output enable register 73 does not receive differential mode control signals ASYNC/ASYNC*. Output enable register 73 operates essentially the same as output register 56 (FIG. 5), except that output enable register 73 does not have N-channel transistors coupled as shown for output register 56 for receiving mode control signals ASYNC/ASYNC*.

Figure 7:
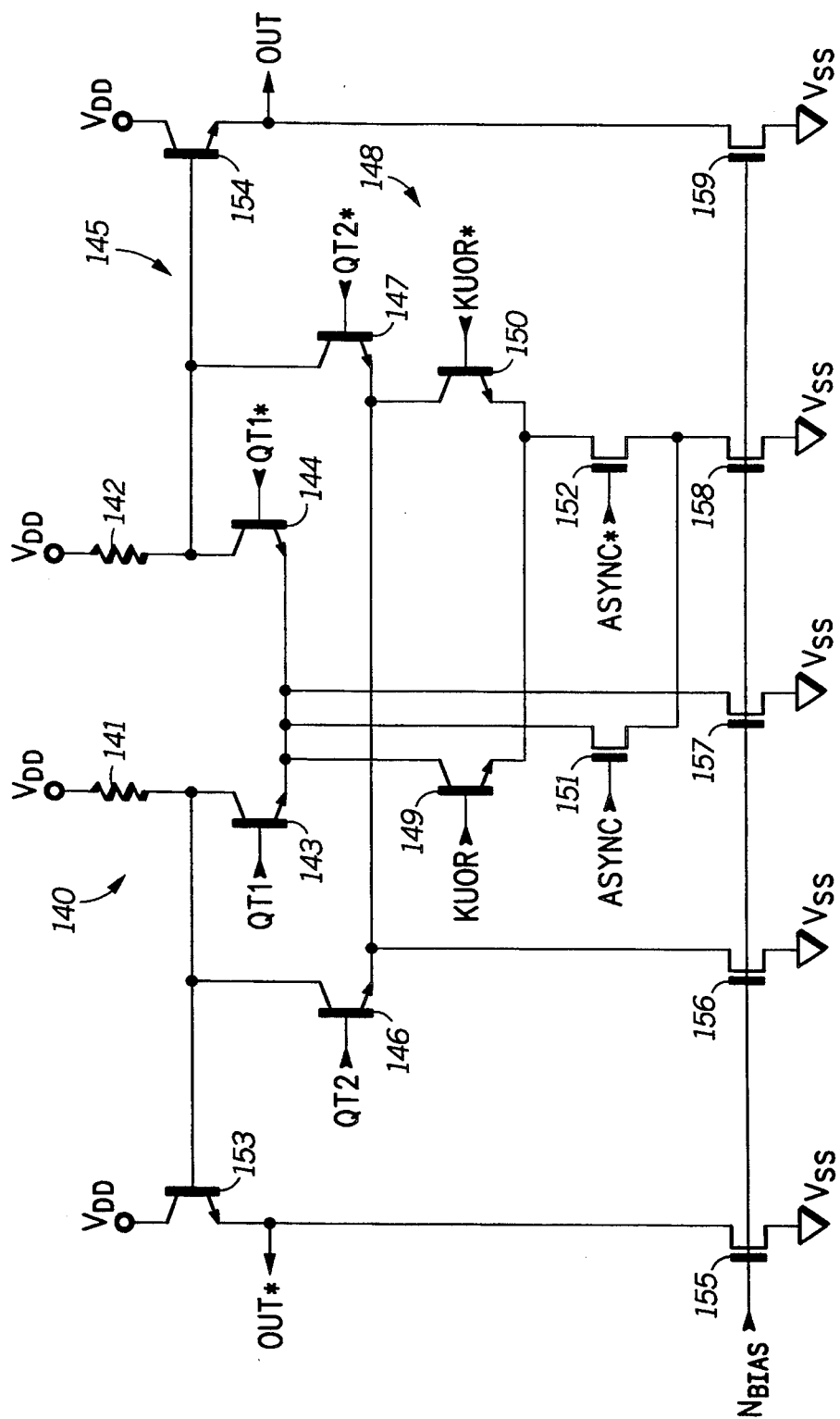
FIG. 7 illustrates in schematic diagram form, the final amplifier of FIG. 2.

FIG. 7 illustrates in schematic diagram form, final amplifier 62 of output registers 34 of FIG. 2. Final amplifier 62 includes differential amplifier 140, differential pair 145, differential pair 148, emitter-follower transistors 153 and 154, and N-channel transistors 151, 152, 155–159. Final amplifier 62 is connected in essentially the same manner as output register 56, except that the emitters of emitter-follower transistors 153 and 154 are not connected to the bases of NPN transistors 146 and 147.

In final amplifier 62, either one of two pairs of differential data signals is selected, differential data signals QT1/QT1* or differential data signals QT2/QT2*. Differential clock signals KUOR/KUOR* determine which differential signal pair is selected. If clock signal KUOR is a logic high and clock signal KUOR* is a logic low, the logic state of differential input signals QT2/QT2* will control the current in resistors 141 and 142. If clock signal KUOR* is higher than clock signal KUOR, then the logic state of differential input signals QT1/QT1* will control the current in resistors 141 and 142. Current is steered through the transistor whose controlling input signal is a higher voltage. For example, if clock signal KUOR is a logic high, then data signals QT2/QT2* control the logic state of output signals OUT/OUT*. Therefore, if input signal QT2* is a logic high, and input signal QT2 is a logic low, current is steered through resistor 142, causing output signal OUT to be a logic low and output signal OUT* to be a logic high. If clock signal KUOR* is a logic high, then data signals QT1/QT1* control the logic state of output signals OUT/OUT*. Therefore, if data signal QT1* is a logic high, and data signal QT1 is a logic low, current is steered through resistor 142, causing output signal OUT to be a logic low and output signal OUT* to be a logic high. On the other hand, if data signal QT1 is a logic low and data signal QT1 * is a logic high when clock signal $K_{ECL}$* is a logic high, current is steered through resistor 141, output signal OUT* will be a logic low and output signal OUT will be a logic high.

As noted above, N-channel transistors 155–159 are used as current sources. N-channel transistors 155 and 159 provide current for emitter-follower transistors 153 and 154, respectively, N-channel transistor 156 supplies a current that is steered by the data signals QT2/QT2* to resistors 141 and 142. N-channel transistors 157 and 158 are low current, voltage level "keepers", that prevent common emitter voltages of differential amplifier 140 and differential pair 145, respectively, from changing if the bases of NPN transistors 149 and 150 are not receiving clock signals KUOR/KUOR*.

Figure 8:
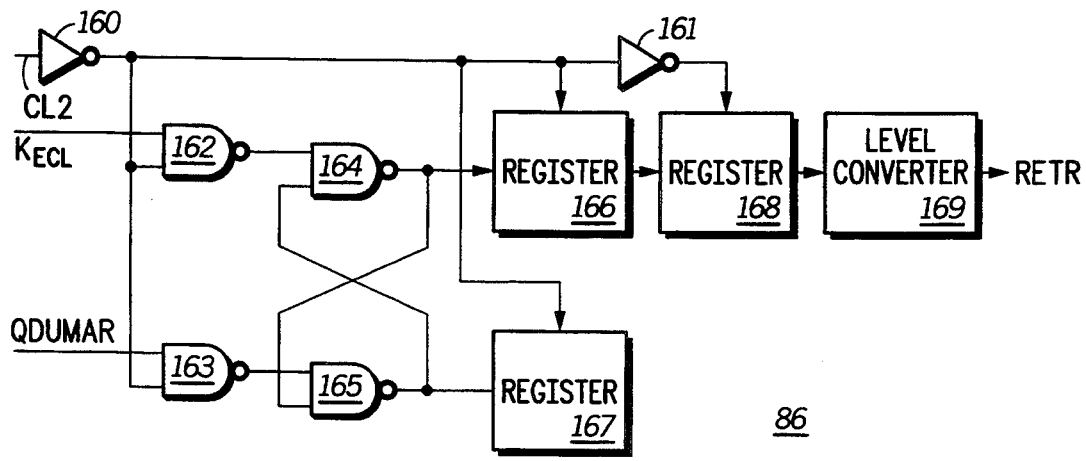
FIG. 8 illustrates in partial logic diagram form and partial block diagram form, the arbiter circuit of FIG. 3.

FIG. 8 illustrates in partial logic diagram form and partial block diagram form, arbiter circuit 86 of read control delay locked loop 44 of FIG. 3. Arbiter circuit 86 includes inverter 160 and 161, NAND logic gates 162, 163, 164, and 165, registers 166, 167, and 168, and level converter 169. Inverter 160 has an input terminal for receiving clock signal CL2, and an output terminal. Inverter 161 has an input terminal connected to the output terminal of inverter 160, and an output terminal. NAND logic gate 162 has a first input terminal for receiving clock signal $K_{ECL}$, a second input terminal connected to the output terminal of inverter 160, and an output terminal. NAND logic gate 163 has a first input terminal for receiving dummy output signal QDUMAR, a second input terminal connected to the output terminal of inverter 160, and an output terminal. NAND logic gate 164 has a first input terminal connected to the output terminal of NAND logic gate 162, a second input terminal, and an output terminal. NAND logic gate 165 has a first input terminal connected to the output terminal of NAND logic gate 163, a second input terminal connected to the output terminal of NAND logic gate 164, and an output terminal connected to the second input terminal of NAND logic gate 164. Register 166 has an input terminal connected to the output terminal of NAND logic gate 164, a control terminal connected to the output terminal of inverter 160, and an output terminal. Register 167 has an input terminal connected to the output terminal of NAND logic gate 165, a control terminal connected to the output terminal of inverter 16. Register 168 has an input terminal connected to the output terminal of register 166, a control terminal connected to the output terminal of inverter 161, and an output terminal. Level converter 169 has an input terminal connected to the output terminal of register 168, and an output terminal for providing CMOS level retard signal RETR.

NAND logic gates 164 and 165 are cross-coupled, and function as a latching flip-flop. The latching flip flop is reset to provide a logic high when both of the input terminals of the NAND logic gates 164 and 165 are a logic low. When the flip-flop is reset, as soon as one of the input signals is a logic high, the output of that NAND logic gate becomes a logic low, and this in turn disables the other NAND logic gate and forces the output of the other NAND logic gate to a logic high.

Clock signal CL2 functions as an enable signal. When clock signal CL2 is a logic high, NAND logic gates 162 and 163 are disabled. When clock signal CL2 is a logic low, which unmasks, or enables, arbiter circuit 86, NAND logic gates 162 and 163 are enabled allowing the state of clock signal $K_{ECL}$ and dummy output signal QDUMAR to propagate through. During this period, both clock signal $K_{ECL}$ and dummy output signal QDUMAR will be at a logic high temporary, which resets the flip-flop. Just before clock signal CL2 becomes a logic high and masks out arbiter circuit 86, one of the inputs will fall low and the latching flip-flop will be set to its proper state. For instance, if clock signal $K_{ECL}$ falls before dummy output signal QDUMAR falls, then the output terminal of NAND logic gate 164 will be a logic low and the output terminal of NAND logic gate 165 will be a logic high. If dummy output signal QDUMAR falls before clock signal $K_{ECL}$ falls, then the output terminal of NAND logic gate 164 will be a logic high and the output terminal of the NAND logic gate 165 will be a logic low. Once clock signal CL2 rises to a logic high, register 166 will latch the current logic state of the output terminal of NAND logic gate 164, and this logic state is provided to register 168. When clock signal CL2 falls again, register 168 latches this information, and this information is converted from a relatively small signal to CMOS level retard signal RETR through level converter 169.

Register 167 is used to equalize the loading for the flip-flop comprising NAND logic gates 164 and 165, so that if the rising or falling edges of clock signal $K_{ECL}$ and dummy output signal QDUMAR occur very close in time relative to each other, the flip-flop will not favor one over the other due to unmatched loading. Note that NAND logic gates 162–165 are implemented as ECL gates.

Figure 9:
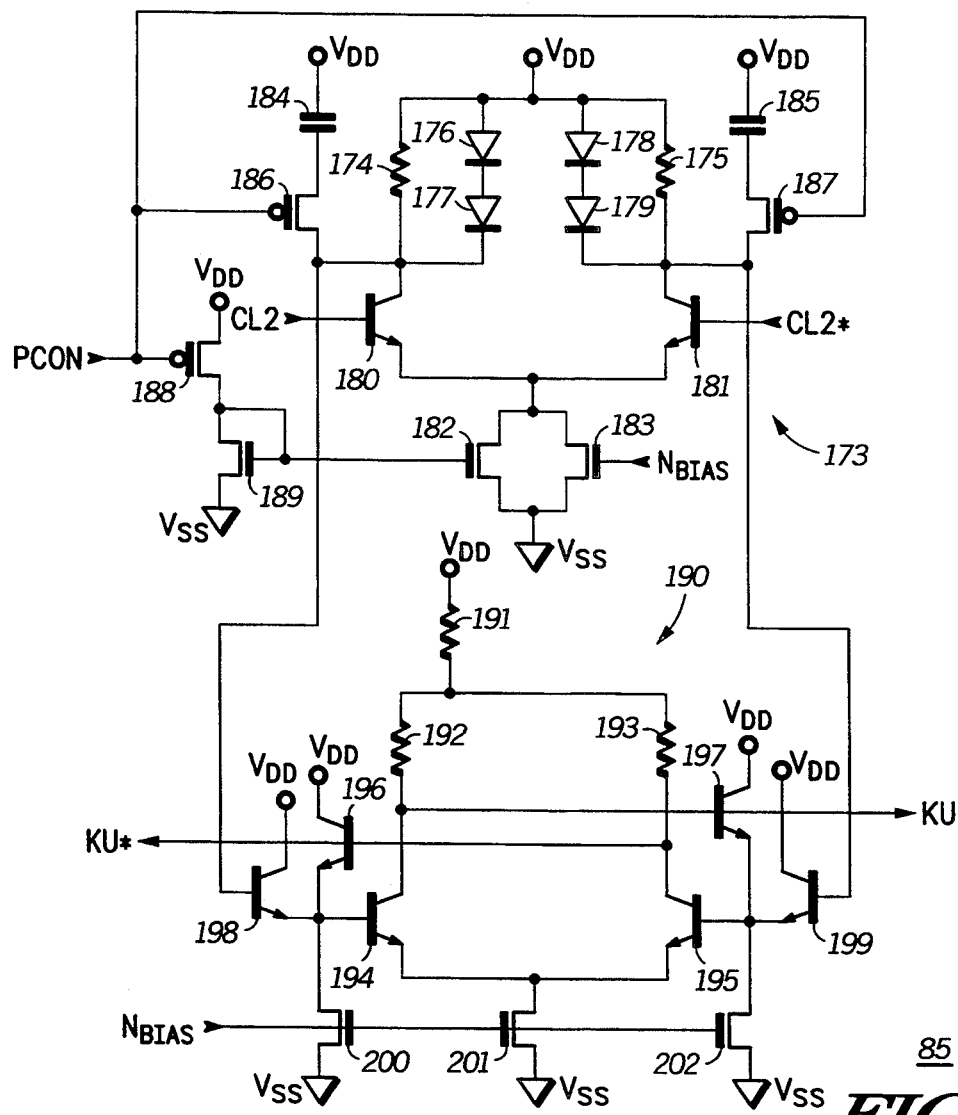
FIG. 9 illustrates in schematic diagram form, the voltage controlled delay circuit of FIG. 3.

FIG. 9 illustrates in schematic diagram form, voltage controlled delay (VCD) circuit 85 of read control delay locked loop 44 FIG. 3. VCD circuit 85 includes differential amplifiers 173 and 190, diodes 176–179, P-channel transistors 186, 187, and 188, N-channel transistors 182, 183, 200, 201, and 202, and NPN transistors 196, 197, 198, and 199. Differential amplifier 173 includes resistors 174 and 175, and NPN transistors 180 and 181. Differential amplifier 190 includes resistors 192 and 193, and NPN transistors 194 and 195.

Resistor 174 has a first terminal connected to $V_{DD}$, and a second terminal. Resistor 175 has a first terminal connected to $V_{DD}$, and a second terminal. NPN transistor 180 has a collector connected to the second terminal of resistor 174, a base for receiving clock signal CL2, and an emitter. NPN transistor 181 has a collector connected to the second terminal of resistor 175, a base for receiving clock signal CL2*, and an emitter connected to the emitter of NPN transistor 180. Diode 176 has a first terminal connected to $V_{DD}$, and a second terminal. Diode 177 has a first terminal connected to the second terminal of diode 176, and a second terminal connected to the collector of NPN transistor 180. Diode 178 has a first terminal connected to $V_{DD}$, and a second terminal. Diode 179 has a first terminal connected to the second terminal of diode 178, and a second terminal connected to the collector of NPN transistor 181. P-channel transistor 188 has a source connected to $V_{DD}$, a gate for receiving control voltage PCON, and a drain. N-channel transistor 189 has a drain and a gate connected to the drain of P-channel transistor 188, and a source connected to $V_{SS}$. N-channel transistor 182 has a drain connected to the emitters of NPN transistors 180 and 181, a gate connected to the drain of P-channel transistor 188, and a source connected to $V_{SS}$. N-channel transistor 183 has a drain connected to the emitters of NPN transistors 180 and 181, a gate for receiving bias voltage $N_{BIAS}$, and a source connected to $V_{SS}$. Capacitor 184 has a first plate electrode connected to $V_{DD}$, and a second plate electrode. Capacitor 185 has a first plate electrode connected to $V_{DD}$, and a second plate electrode. P-channel transistor 186 has a source connected to the second plate electrode of capacitor 184, a gate connected to the gate P-channel transistor 188 for receiving control voltage PCON, and a drain connected to the collector of NPN transistor 180. P-channel transistor 187 has a source connected to the second plate electrode of capacitor 185, a gate connected to the gate of P-channel transistor 188 for receiving control voltage PCON, and a drain connected to the collector of NPN transistor 181.

Resistor 192 has a first terminal connected to $V_{DD}$, and a second terminal. Resistor 193 has a first terminal connected to $V_{DD}$, and a second terminal. NPN transistor 194 has a collector connected to the second terminal of resistor 192 for providing clock signal KU, a base, and an emitter. NPN transistor 195 has a collector connected to the second terminal of resistor 193 for providing clock signal KU*, a base, and an emitter connected to the emitter of NPN transistor 194. NPN transistor 196 has a collector connected to $V_{DD}$, a base connected to the collector of NPN transistor 195, and an emitter connected to the base of NPN transistor 194. NPN transistor 197 has a collector connected to $V_{DD}$, a base connected to the collector of NPN transistor 194, and an emitter connected to the base of NPN transistor 195. NPN transistor 198 has a collector connected to $V_{DD}$, a base connected to the drain of P-channel transistor 186, and an emitter connected to the base of NPN transistor 194. NPN transistor 199 has a collector connected to $V_{DD}$, a base connected to the drain of P-channel transistor 187, and an emitter connected to the base of NPN transistor 195. N-channel transistor 200 has a drain connected to the emitters of NPN transistors 196 and 198, a gate for receiving bias voltage $N_{BIAS}$, and a source connected to $V_{SS}$. N-channel transistor 201 has a drain connected to the emitters of NPN transistors 194 and 195, a gate for receiving bias voltage $N_{BIAS}$, and a source connected to $V_{SS}$. N-channel transistor 202 has a drain connected to the emitters of NPN transistors 197 and 199, a gate for receiving bias voltage $N_{BIAS}$, and a source connected to $V_{SS}$.

In VCD circuit 85, the output excursion and the output slew rate at the collectors of NPN transistors 180 and 181 are two variables which are used to vary the propagation delay of VCD circuit 85. Complementary clock signals CL2/CL2*, are provided to differential amplifier 173. Differential amplifier 173 has two current sources, N-channel transistors 182 and 183. N-channel transistor 183 provides a relatively constant current source. N-channel transistor 182 functions as a variable current source. The amount of current provided by N-channel transistor 183 depends on the voltage level of control voltage PCON. If the voltage of control voltage PCON decreases, the amount of current provided by N-channel transistor 182 increases. When N-channel transistor 182 is substantially non-conductive, that is, when control voltage PCON is equal to approximately $V_{DD}$, N-channel transistor 183 provides just enough current for differential amplifier 173 to continue to function.

Resistors 174 and 175 are fixed in value, and the voltage across them depends on the current provided by N-channel transistor 182. Diodes 176, 177, 178, and 179 are used to clamp the voltage across resistors 174 and 175 from about two base-emitter diode voltage drops ($V_{BE}$) to about two and one-half $V_{BE}$. This is done to protect the NPN transistors 180 and 181 from operating in saturation when VCD circuit 85 receives a relatively high power supply voltage.

When control voltage PCON is at a voltage equal to about $V_{DD}$, P-channel transistors 186 and 187 are substantially non-conductive, and the collectors of NPN transistors 180 and 181 are electrically uncoupled from capacitors 184 and 185. Since only N-channel transistor 183 is conductive, an excursion voltage across resistors 174 and 175 is small, that is, less than about 200 millivolts in a preferred embodiment. However, when control voltage PCON is at a voltage lower than $V_{DD}$ minus a P-channel threshold voltage, then a voltage swing across resistors 174 and 175 will be larger and a rise time at the collectors of NPN transistors 180 and 181 will be slower due to additional capacitive loading provided by capacitors 184 and 185.

The voltage at the collectors of NPN transistors 180 and 181 is provided to differential amplifier 190 through NPN transistors 198 and 199. At this stage, the voltages at the collectors of NPN transistors 180 and 181 are compared with the voltages at the collectors of NPN transistors 194 and 195. If the voltages at the collectors of NPN transistors 180 and 181 are higher than the voltages at the collectors of NPN transistors 194 and 195, then the voltages at the collectors of NPN transistors 194 and 195 are ignored, and differential clock signals KU and KU* changes logic states when the voltages at the collectors of NPN transistors 180 and 181 changes. If one of the voltages at either of the collectors of NPN transistors 180 or 181 is lower than the higher of the voltages at the collectors of NPN transistors 194 and 195, then clock signals KU and KU* only change states when the lower voltage from the collectors of NPN transistors 180 and 181 passes the higher voltage of the voltages of NPN transistors 194 and 195. The increased excursion voltage across resistors 174 and 175, and slower rise time of the voltage at the collectors of NPN transistors 180 and 181, increases the propagation delay of the VCD circuit 85.

One characteristic of VCD circuit 85 is that when control voltage PCON is low, such that the propagation delay is longer than one-half a period of clock signal CL2, VCD circuit 85 collapses. As discussed above, this occurs when clock signals (CL2/CL2*) are toggling, but delayed clock signal (KU) is not changing state as a result. This is caused by having too much capacitive loading coupled to the collectors of NPN transistors 180 and 181 through P-channel transistors 186 and 187, respectively. Because of this characteristic, delayed clock signal KU is not more than 180 degree out of phase with clock signal CL2 in a preferred embodiment. Therefore, delay locked loop 44 is prevented from delaying delayed clock signal KU for too long. If delayed clock signal KU was delayed for too long, delay locked loop 44 may incorrectly lock onto a later cycle, for example a cycle occurring later than 360 degrees out of phase.

In VCD circuit 85, small signal levels or ECL level signals are used, eliminating the need to level convert the ECL level signals to a CMOS logic level. In addition, VCD circuit 85 has a relatively high maximum delay to minimum delay ratio compared to a prior art shunt-capacitor VCD, and is less sensitive to noise as compared to a prior art starved-inverter VCD.

Figure 10:
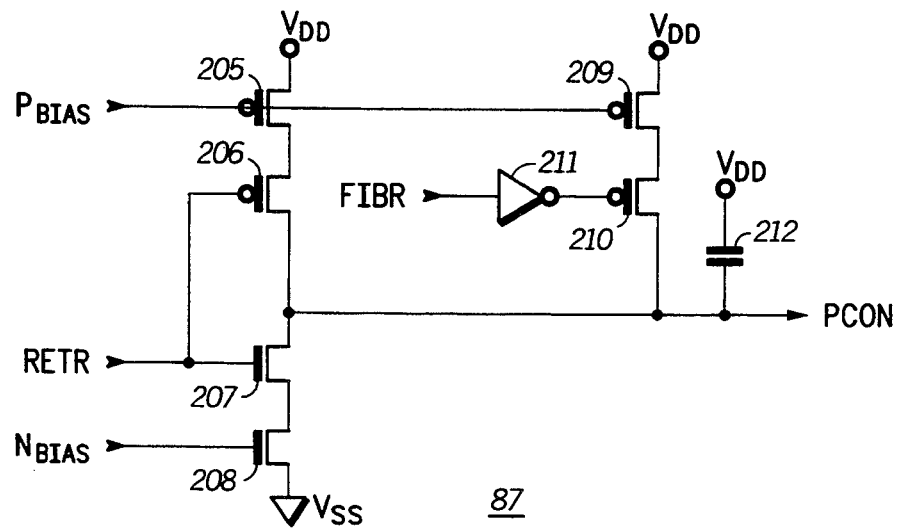
FIG. 10 illustrates in schematic diagram form, the VCD control circuit of FIG. 3.

FIG. 10 illustrates in schematic diagram form, VCD control circuit 87 of read control delay locked loop 44 of FIG. 3. VCD control circuit 87 receives retard signal RETR, and in response, generates control voltage PCON for voltage controlled delay circuit 85. VCD control circuit 87 includes P-channel transistors 205, 206, 209, and 210, N-channel transistors 207 and 208, inverter 211, and capacitor 212.

P-channel transistor 205 has a source connected to $V_{DD}$, a gate for receiving bias voltage $P_{BIAS}$, and a drain. P-channel transistor 206 has a source connected to the drain of P-channel transistor 205, a gate for receiving retard signal RETR, and a source for providing control voltage PCON. N-channel transistor 207 has a drain connected to the drain of P-channel transistor 206, a gate connected to the gate of P-channel transistor 206, and a source. N-channel transistor 208 has a drain connected to the source of N-channel transistor 207, a gate for receiving bias voltage $N_{BIAS}$, and a source connected to $V_{SS}$. P-channel transistor 209 has a source connected to $V_{DD}$, a gate connected to the gate of P-channel transistor 205 for receiving bias voltage $P_{BIAS}$, and a drain. P-channel transistor 210 has a source connected to the drain of P-channel transistor 209, a gate, and a drain connected to the drain of P-channel transistor 206. Capacitor 212 has a first plate electrode connected to $V_{DD}$, and a second plate electrode connected to the drain of P-channel transistor 206. Inverter 211 has an input terminal for receiving collapse detector output signal FIBR, and an output terminal connected to the gate of P-channel transistor 210.

The purpose of VCD control circuit 87 is to generate analog control voltage PCON. Control voltage PCON is used to control the propagation delay provided by VCD circuit 85. When retard signal RETR is a logic high, N-channel transistor 207 is conductive, and P-channel transistor 206 is substantially non-conductive, allowing a small amount of charge to leak from capacitor 212 to $V_{SS}$, which in turn causes control voltage PCON to decrease toward $V_{SS}$ by a relatively small amount. The relative size of N-channel transistor 208, the voltage level of bias voltages $N_{BIAS}$ and $P_{BIAS}$, the relative size of capacitor 212, and the time in which retard signal RETR is a logic high determines how fast control voltage PCON changes, and are adjusted to give the required performance. Similarly, when retard signal RETR is a low voltage, N-channel transistor 207 is off and P-channel transistor 206 is on, and a small amount of current flows through P-channel transistors 205 and 206, which charges capacitor 212 and increases the voltage of control voltage PCON toward $V_{DD}$ by a relatively small amount.

During normal operation, delayed clock signal KU is always toggling, and collapse detector signal FIBR is a logic low. However, when VCD circuit collapses (as discussed above), then collapse detector signal FIBR becomes a logic high, resulting in P-channel transistor 210 becoming conductive. P-channel transistor 209 is larger than P-channel transistor 205, thus more current flows to capacitor 212, which in turn causes control voltage PCON to increase more quickly. Collapse detector signal FIBR remains a logic high until delayed clock signal KU is again changing logic states regularly.

Figure 11:
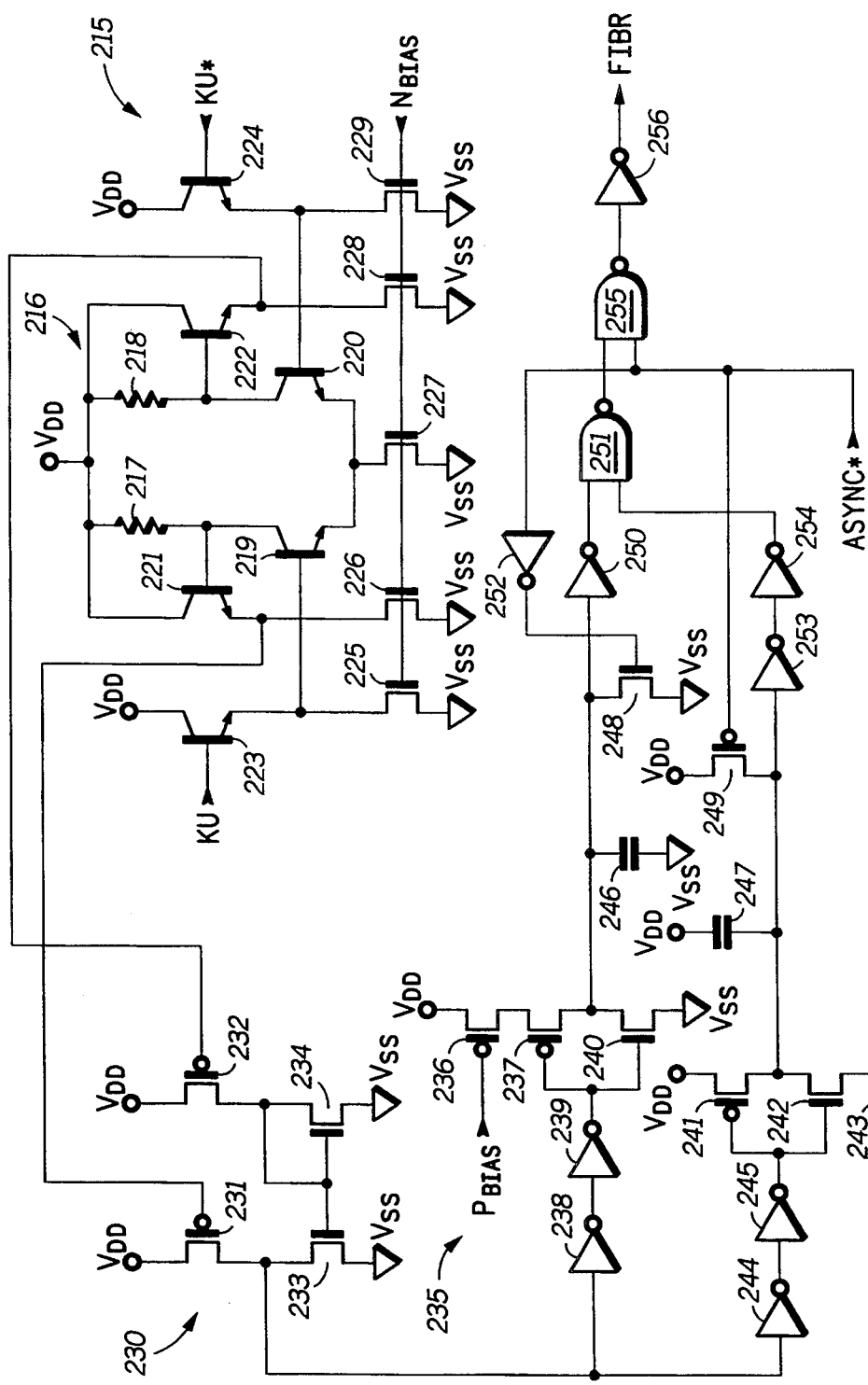
FIG. 11 illustrates in partial logic diagram form and partial schematic diagram form, the collapse detector circuit of FIG. 3.

FIG. 11 illustrates in partial logic diagram form and partial schematic diagram form, collapse detector circuit 88 of delay locked loop circuit 44 of FIG. 3. Collapse detector circuit 88 includes level converter first stage 215, level converter second stage 230, and collapse detector 235. Level converter first stage 215 includes differential amplifier 216, emitter-follower transistors 221, 222, 223, 224, and N-channel transistors 225–229. Differential amplifier 216 includes resistors 217 and 218, and NPN transistors 219 and 220. Level converter second stage includes P-channel transistors 231 and 232, and N-channel transistors 233 and 234. Collapse detector 235 includes P-channel transistors 236, 237, 241, 242, and 249, N-channel transistors 240, 243, and 248, inverters 238, 239, 244, 245, 252, 253, 254, and 256, capacitors 246 and 247, and NAND logic gates 251 and 255.

Resistor 217 has a first terminal connected to $V_{DD}$, and a second terminal. Resistor 218 has a first terminal connected to $V_{DD}$, and a second terminal. NPN transistor 219 has a collector connected to the second terminal of resistor 217, a base, and an emitter. NPN transistor 220 has a collector connected to the second terminal of resistor 218, a base, and an emitter connected to the emitter of NPN transistor 219. Emitter-follower transistor 221 has a collector connected to $V_{DD}$, a base connected to the second terminal of resistor 217, and an emitter. Emitter-follower transistor 222 has a collector connected to $V_{DD}$, a base connected to the second terminal of resistor 218, and an emitter. Emitter-follower transistor 223 has a collector connected t $V_{DD}$, a base for receiving clock signal KU, and an emitter connected to the base of NPN transistor 219. Emitter-follower transistor 224 has a collector connected to $V_{DD}$, a base for receiving clock signal KU*, and an emitter connected to the base of NPN transistor 220. N-channel transistor 225 has a drain connected to the emitter of emitter-follower transistor 223, a gate for receiving bias voltage $N_{BIAS}$, and a source connected to $V_{SS}$. N-channel transistor 226 has a drain connected to the emitter of emitter-follower transistor 221, a gate for receiving bias voltage $N_{BIAS}$, and a source connected to $V_{SS}$. N-channel transistor 227 has a drain connected to the emitters of NPN transistors 219 and 220, a gate for receiving bias voltage $N_{BIAS}$, and a source connected to $V_{SS}$. N-channel transistor 228 has a drain connected to the emitter of emitter-follower transistor 222, a gate for receiving bias voltage $N_{BIAS}$, and a source connected to $V_{SS}$. N-channel transistor 229 has a drain connected to the emitter of emitter-follower transistor 224, a gate for receiving bias voltage $N_{BIAS}$, and a source connected to $V_{SS}$.

P-channel transistor 231 has a source connected to $V_{DD}$, a gate connected to the emitter of emitter-follower transistor 221, and a drain. N-channel transistor 233 has a drain connected to the drain of P-channel transistor 231, a gate, and a source connected to $V_{SS}$. P-channel transistor 232 has a source connected to $V_{DD}$, a gate connected to the emitter of emitter-follower transistor 222, and a drain. N-channel transistor 234 has a drain and a gate connected to the drain of P-channel transistor 232, and a source connected to $V_{SS}$.

P-channel transistor 236 has a source connected to $V_{DD}$, a gate for receiving bias voltage $P_{BIAS}$, and a drain. P-channel transistor 237 has a drain connected to the drain of P-channel transistor 236, a gate, and a drain. N-channel transistor 240 has a drain connected to the drain of P-channel transistor 237, a gate connected to the gate of P-channel transistor 237, and a source connected to $V_{SS}$. Inverter 238 has an input terminal connected to the drain of P-channel transistor 231, and an output terminal. Inverter 239 has a input terminal connected to the output terminal of inverter 238, and an output terminal connected to the gate of P-channel transistor 237. P-channel transistor 241 has a source connected to $V_{DD}$, a gate, and a drain. N-channel transistor 242 has a drain connected to the drain of P-channel transistor 241, a gate connected to the gate of P-channel transistor 241, and a source. N-channel transistor 243 has a drain connected to the source of N-channel transistor 242, a gate for receiving bias voltage $N_{BIAS}$, and a source connected to $V_{SS}$. Inverter 244 has an input terminal connected to the drain of P-channel transistor 231, and an output terminal. Inverter 245 has an input terminal connected to the output terminal of inverter 244, and an output terminal. Capacitor 246 has a first plate electrode connected to the drain of P-channel transistor 237, and a second plate electrode connected to $V_{SS}$. Capacitor 247 has a first plate electrode connected to $V_{DD}$, and a second plate electrode connected to the drain of P-channel transistor 241. N-channel transistor 248 has a drain connected to the drain of P-channel transistor 237, a gate, and a source connected to $V_{SS}$. P-channel transistor 249 has a source connected to $V_{DD}$, a gate for receiving mode control signal ASYNC*, and a drain connected to the drain of P-channel transistor 241. Inverter 250 has an input terminal connected to the drain of P-channel transistor 237, and an output terminal. Inverter 253 has an input terminal connected to the drain of P-channel transistor 241, and an output terminal. Inverter 254 has an input terminal connected to the output terminal of inverter 253, and an output terminal. NAND logic gate 251 has a first input terminal connected to the output terminal of inverter 250, a second input terminal connected to the output terminal of inverter 254, and an output terminal. NAND logic gate 255 has a first input terminal connected to the output terminal of NAND logic gate 251, a second input terminal for receiving mode control signal ASYNC*, and an output terminal. Inverter 252 had an input terminal connected to the second input terminal of NAND logic gate 255 for receiving mode control signal ASYNC*, and an output terminal connected to the gate of N-channel transistor 248. Inverter 256 has an input terminal connected to the output terminal of NAND logic gate 255, and an output terminal for providing collapse detector output signal FIBR.

As noted above, the function of collapse detector circuit 88 is to detect whether or not VCD circuit 85 "collapses". VCD circuit 85 collapses when the voltage of control voltage PCON is at a wrong value, and causes VCD circuit 85 to have too much propagation delay, such that clock signal CL2 switches to an opposite logic state before delayed clock signal KU can change logic states. VCD circuit 85 may collapse during power up, when the internal circuit nodes are at unknown states. If VCD circuit 85 collapses, and dummy output signal QDUMAR is a logic low, arbiter circuit 86 may determine that dummy output signal QDUMAR is faster than clock signal $K_{ECL}$, since dummy output signal QDUMAR does not transition to a logic high voltage for resetting the flip-flop comprising NAND logic gates 164 and 165 (FIG. 8). As a result, arbiter circuit 86 incorrectly provides retard signal RETR to VCD control circuit 87 in order to increase the propagation delay of stalled delayed clock signal KU. This results in VCD circuit 85 remaining in a collapsed state.

To prevent VCD circuit 85 from collapsing, collapse detector circuit 88 monitors differential delayed clock signals KU/KU*. Delayed clock signals KU/KU* are converted from ECL level signals to CMOS level signals by level converter first stage 215 and level converter second stage 230. CMOS level signals corresponding to delayed clock signals KU/KU* are provided to inverters 238 and 244 of collapse detector 235. When delayed clock signals KU/KU* are toggling, then the drain of N-channel transistor 240 has a voltage equal to about $V_{SS}$, and the drain of P-channel transistor 241 has a voltage equal to about $V_{DD}$. The sizes of N-channel transistor 240 and P-channel transistor 241 are larger than the sizes of P-channel transistors 237 and 236, and N-channel transistors 242 and 243, so that P-channel transistors 237 and 236, and N-channel transistors 242 and 243 will have little affect the voltage on the drain of N-channel transistor 240 and P-channel transistor 241 when N-channel transistor 240 and P-channel transistor 241 are substantially non-conductive. However, when clock signals KU and KU* are not toggling, then only one of P-channel transistor 237 or N-channel transistor 242 will be conductive, and the other transistor will be substantially non-conductive. If clock signals KU and KU* do not change logic states for a relatively long period of time (greater than about 200 nanoseconds in a preferred embodiment), then the drain of N-channel transistor 240 will charge up to a voltage equal to about $V_{DD}$ if P-channel transistor 237 is conductive, or the drain of P-channel transistor 241 will leak down to about $V_{SS}$ if N-channel transistor 242 is conductive. The capacitance of capacitors 246 and 247 determines the amount of time collapse detector 235 waits before signaling the collapse of VCD circuit 85. In a preferred embodiment, a collapse occurs if clock signal KU does not change logic states when about 200 nanoseconds. Once the collapse occurs, collapse detector signal FIBR is asserted as a logic high. However, during the asynchronous operating mode, the period of clock signal CLK may be longer than 200 nanoseconds. Therefore, while in asynchronous operating mode control signal ASYNC* is asserted as a logic low to disable collapse detector 235.

Figure 12:
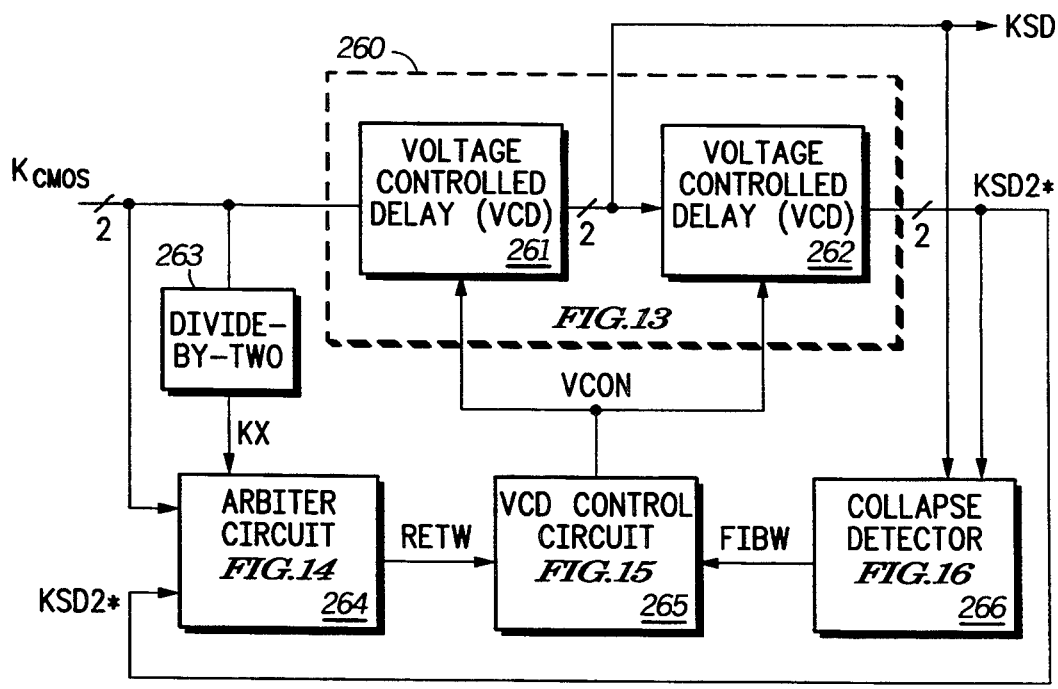
FIG. 12 illustrates in block diagram form the write control delay locked loop of FIG. 1.

FIG. 12 illustrates in block diagram form, write control delay locked loop 52 of memory 20 of FIG. 1. Write control delay locked loop 52 includes VCD circuit 260, divide-by-two circuit 263, arbiter circuit 264, VCD control circuit 265, and collapse detector 266. VCD circuit 260 includes first VCD 261 and second VCD 262.

First VCD 261 has an input terminal for receiving clock signal $K_{CMOS}$, a control terminal for receiving a control voltage labeled "VCON", and an output terminal for providing clock signal KSD. Second VCD circuit 262 has an input terminal for receiving clock signal KSD, a control terminal for receiving control voltage VCON, and an output terminal for providing a clock signal labeled "KSD2*". Divide-by-two circuit 263 has an input terminal for receiving clock signal $K_{CMOS}$, and an output terminal for providing a clock signal labeled "KX". Arbiter circuit 264 has a first input terminal for receiving clock signal $K_{CMOS}$, a second input terminal connected to the output terminal of second VCD circuit 262 for receiving clock signal KSD2*, a control terminal connected to the output terminal of divide-by-two circuit 263 for receiving clock signal KX, and an output terminal for providing write a retard signal labeled "RETW". VCD control circuit 265 has an input terminal connected to the output terminal of arbiter circuit 264 for receiving write retard signal RETW, a second input terminal for receiving a collapse detector signal labeled "FIBW", and an output terminal for providing control voltage VCON. Collapse detector 266 has a first input terminal connected to the output terminal of first VCD circuit 260 for receiving clock signal KSD, a second input terminal coupled to the output terminal of second VCD 262 for receiving clock signal KSD2*, and an output terminal connected to the second input terminal of VCD control circuit 265 for providing collapse detector output signal FIBW.

FIG. 12 illustrates the delay locked loop circuits which are used to control a write cycle of memory 20. First VCD 261 receives CMOS level clock signal $K_{CMOS}$ and delays it by 90 degrees to generate CMOS level delayed clock signal KSD. The delay provided by VCD circuit 260 is controlled by the value of control voltage VCON. When control voltage VCON is high, the delay of VCD circuit 260 is relatively large, when control voltage VCON is low, the delay of VCD circuit 260 is relatively small. Second VCD 262 receives CMOS signal KSD and delays it another 90 degrees to generate delayed clock signal KSD2* which is 180 degrees delayed from clock signal $K_{CMOS}$. Divide-by-two circuit 263 receives clock signal $K_{CMOS}$ and generates clock signal KX which is one-half the frequency of $K_{CMOS}$. Arbiter circuit 264 receives clock signals $K_{CMOS}$, KSD2*, and KX, and compares the timing of clock signal $K_{CMOS}$ to clock signal KSD2* when clock signal KX is a logic high. If clock signal KSD2* rises before clock signal $K_{CMOS}$, then clock signal KSD2* is too early and retard signal RETW is provided as a logic high for that cycle. If clock signal KSD2* rises after clock signal $K_{CMOS}$, then clock signal KSD2* is too late and retard signal RETW is provided as a logic low for that cycle.

VCD control circuit 265 receives retard signal RETW and collapse detector signal FIBW, and increases the voltage of control voltage VCON if retard signal RETW is a logic high, or decreases the value of control voltage VCON if retard signal RETW is a logic low.

Collapse detector 266 receives delayed clock signal KSD and clock signal $K_{CMOS}$, and detects if the delay imposed on clock signal KSD2* is greater than the operating range of arbiter circuit 264. When this is the case, collapse detector signal FIBW is driven to a logic high, which allows VCD control circuit 265 to drive control voltage VCON lower. When control voltage VCON is reduced, the propagation delay provided by VCD circuit 260 is reduced, causing delayed clock signal KSD to occur sooner.

Write control logic 54 provides decoded write control signal WCQ. Write control signal WCQ is a pulse which is active as a logic high. A width of the pulse is equal to the logic high pulse width of delayed clock signal KSD. When write control signal WCQ is a logic high, bit line loads/write drivers 30 write data into memory array 22. When write control signal WCQ returns to a logic low, the write cycle is terminated and write recovery takes place. The write operation takes place in parallel with the memory array decoding, which is initiated when clock signal $K_{CMOS}$ becomes a logic high.

Due to the 90 degree delay generated by first VCD 261 with respect to clock signal $K_{CMOS}$, if the cycle time of clock signal $K_{CMOS}$ increases, the cycle time of a write cycle increases by 25% of the amount clock signal $K_{CMOS}$ increases. The duration of the write cycle is increased by the same amount as the time clock signal $K_{CMOS}$ is a logic high, which is about 50% of the cycle time. The time from the end of a write cycle to the next read cycle (write recovery time) increases by 25% of the increase in the cycle time of clock signal $K_{CMOS}$.

By allowing the timing of a write cycle to change, write timing margins can be increased proportionally to the increase in cycle time. Thus, deviations in the manufacturing process of memory 20 can be compensated for by adjusting the write cycle time of memory 20. This is analogous to having different speed bins for asynchronous SRAMS where parts that have poor performance can be tested to looser specifications for the read and write cycle parameters.

If delayed clock signal KSD was generated by a fixed delay, the start of the write cycle would not change if the clock cycle time was changed. Also, temperature, power supply voltage, and process deviations of memory 20, may cause a race condition where the write cycle may occur too fast, and a previously decoded memory array location may be inadvertently written into. Using write control delay locked loop 52 avoids the race condition by adjusting the write cycle time of memory 20 so that if one part of the write cycle timing is increased, all of the write timing margins are increased. By adjusting the write cycle time of memory 20 during testing, deviations in process parameters and operating conditions can be compensated for, thus increasing yield during fabrication of memory 20.

Figure 13:
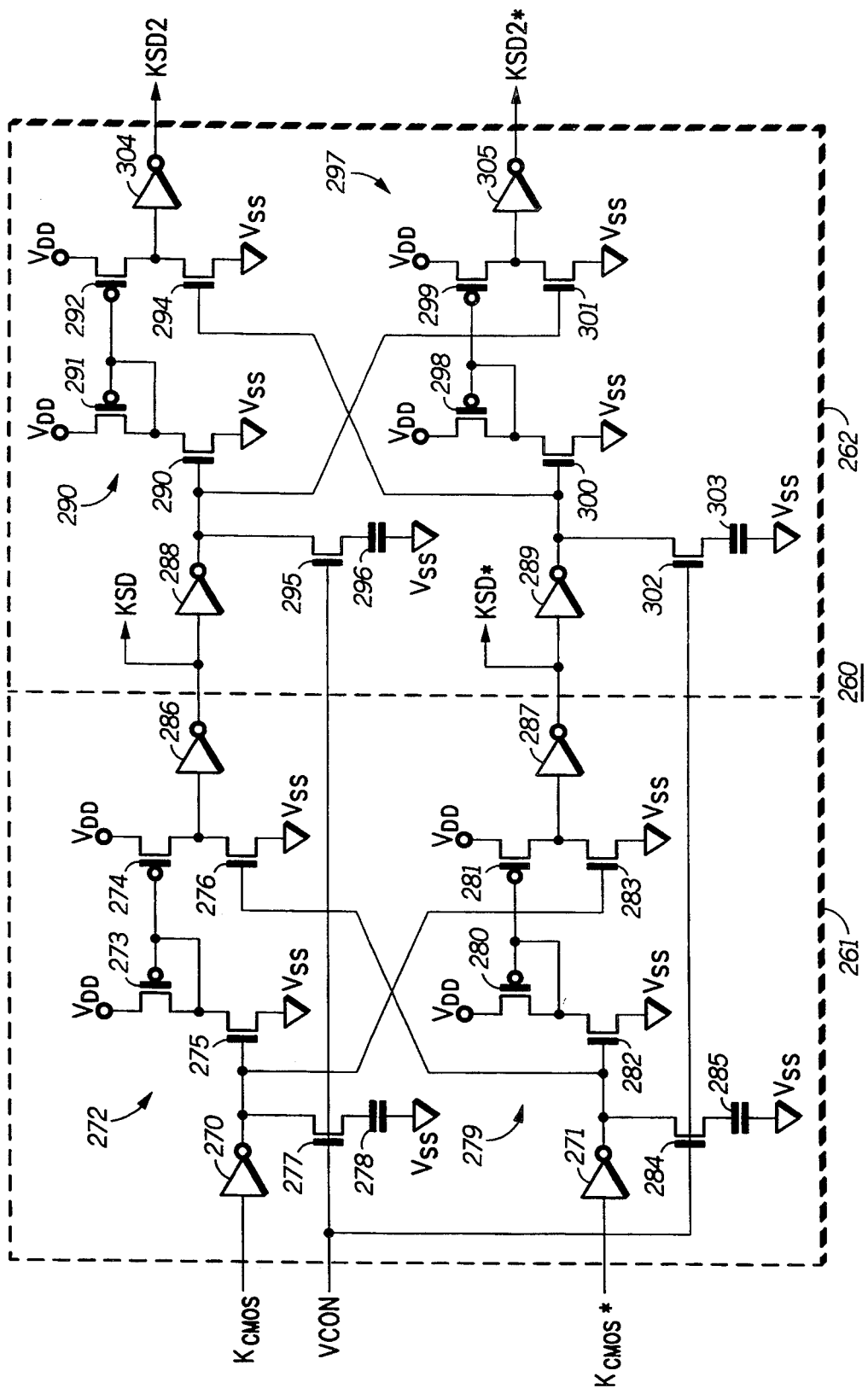
FIG. 13 illustrates in partial schematic diagram form and partial logic diagram form, the voltage controlled delay circuits of FIG. 12.

FIG. 13 illustrates in partial schematic diagram form and partial logic diagram form, VCD circuit 260 of write control delay locked loop 52 of FIG. 12. VCD circuit 260 includes first VCD 261 and second VCD 262. First VCD 261 includes inverters 270, 271, 286, and 287, differential amplifiers 272 and 279, N-channel transistors 277 and 284, and capacitors 278 and 285. Differential amplifier 272 includes P-channel transistors 273 and 274, and N-channel transistors 275 and 276. Differential amplifier 279 includes P-channel transistors 280 and 281, and N-channel transistors 282 and 283. Second VCD circuit 262 includes inverters 288, 289, 304, and 305, differential amplifiers 290 and 297, N-channel transistors 295 and 302, and capacitors 296 and 303. Differential amplifier 290 includes P-channel transistors 291 and 292, and N-channel transistors 293 and 394. Differential amplifier 297 includes P-channel transistors 298 and 299, and N-channel transistors 300 and 301.

P-channel transistor 273 has a source connected to $V_{DD}$, a gate, and a drain. N-channel transistor 275 has a drain connected to the drain of P-channel transistor 273, a gate, and a source connected to $V_{SS}$. P-channel transistor 274 has a source connected to $V_{DD}$, a gate connected to the gate of P-channel transistor 273, and a drain. N-channel transistor 276 has a drain connected to the drain of P-channel transistor 274, a gate, and a source connected to $V_{SS}$. Inverter 270 has an input terminal for receiving clock signal $K_{CMOS}$, and an output terminal connected to the gate of N-channel transistor 275. N-channel transistor 277 has a drain connected to the output terminal of inverter 270, a gate for receiving control voltage VCON, and a source. Capacitor 278 has a first plate electrode connected to the source of N-channel transistor 278, and a second plate electrode connected to $V_{SS}$. Inverter 271 has an input terminal for receiving clock signal $K_{CMOS}$, and an output terminal connected to the gate of N-channel transistor 276. N-channel transistor 284 has a drain connected to the output terminal of inverter 271, a gate for receiving control voltage VCON, and a source. Capacitor 285 has a first plate electrode connected to the source of N-channel transistor 284, and a second plate electrode connected to $V_{SS}$. P-channel transistor 280 has a source connected to $V_{DD}$, a gate, and a drain. N-channel transistor 282 has a drain connected to both the drain and gate of P-channel transistor 280, a gate connected to the output terminal of inverter 271, and a source connected to $V_{SS}$. P-channel transistor 281 has a source connected to $V_{DD}$, a gate connected to the gate of P-channel transistor 280, and a drain. N-channel transistor 283 has a drain connected to the drain of P-channel transistor 281, a gate connected to the output terminal of inverter 270. Inverter 287 has an input terminal connected to the drain of P-channel transistor 281, and an output terminal for providing clock signal KSD*.

Inverter 288 has an input terminal connected to the output terminal of inverter 286, and an output terminal. N-channel transistor 295 has a drain connected to the output terminal of inverter 288, a gate for receiving control voltage VCON, and a source. Capacitor 296 has a first plate electrode connected to the source of N-channel transistor 295, and a second plate electrode connected to $V_{SS}$. P-channel transistor 291 has a source connected to $V_{DD}$, a gate, and a drain. P-channel transistor 292 has a source connected to $V_{DD}$, a gate connected to both the gate and drain of P-channel transistor 291, and a drain. N-channel transistor 294 has a drain connected to the drain of P-channel transistor 292, a gate, and a source connected to $V_{SS}$. Inverter 304 has an input terminal connected to the drain of P-channel transistor 292, and an output terminal for providing clock signal KSD2. Inverter 289 has an input terminal connected to the output terminal of inverter 287, and an output terminal connected to the gate of N-channel transistor 294. N-channel transistor 302 has a drain connected to the output terminal of inverter 289, a gate for receiving control voltage VCON, and a source. Capacitor 303 has a first plate electrode connected to the source of N-channel transistor 302, and a second plate electrode connected to $V_{SS}$. P-channel transistor 298 has a source connected to $V_{DD}$, a gate, and a drain. N-channel transistor 300 has a drain connected to the drain of P-channel transistor 298, a gate connected to the output terminal of inverter 289, and a source connected to $V_{SS}$. P-channel transistor 299 has a source connected to $V_{DD}$, a gate connected to both the gate and drain of P-channel transistor 298, and a drain. N-channel transistor 301 has a drain connected to the drain of P-channel transistor 299, a gate connected to the gate of N-channel transistor 293, and a source connected to $V_{SS}$. Inverter 305 has an input terminal connected to the drain of P-channel transistor 299, and an output terminal for providing clock signal KSD2*.

Control voltage VCON, which is generated by VCD control circuit 265 determines how much capacitive loading is added to the output terminals of inverters 270, 271, 288, and 289. The amount of delay added is the same for both first VCD 261 and second VCD 262. In a preferred embodiment, delayed clock signal KSD is generated ¼ cycle after clock signal $K_{CMOS}$. VCD circuit 260 differs from prior art shunt-capacitor VCD, in that differential amplifiers 272, 279, 290, and 297 are added after the driver stage inverters 270, 271, 188, and 189, respectively. The purpose of differential amplifiers 272, 279, 290, and 297 is to re-normalize, or buffer, delayed clock signals KSD and KSD2*. For example, when control voltage VCON is at a relatively high level (near $V_{DD}$), the propagation delay provided by VCD circuit 260 is at a maximum value. When the propagation delay is at the maximum value, differential amplifiers 272, 279, 290, and 297 prevent delayed clock signals KSD and KSD2* from becoming distorted and having a slow ramp rate. The differential amplifiers correct the distorted wave form of delayed clock signals KSD and KSD2* and re-normalize them to improve the ramp rate.

The gates of N-channel transistors 276 and 283, and the gates of N-channel transistors 294 and 301 are cross-coupled. This is to ensure that the delayed clock signals KSD and KSD2* have a 50% duty-cycle. Inverters 286 and 287 are used to buffer the signals to second VCD 262. Since the loads for inverters 270, 271, 288, and 289 are substantially the same, the propagation delay from clock signal $K_{CMOS}$ to delayed differential clock signals KSD/KSD* and KSD2/KSD2* will be almost identical, and the delay will vary by an equal amount. This in turn allows the write margins to vary by an equal amount. In a preferred embodiment, the write set-up margin is about ¼ cycle of the write cycle time, and the actual write takes about ½ cycle of write cycle time. The write recovery uses the remaining ¼ cycle. By having the write margins depend on the write cycle time allows a designer to still debug memory 20 at a slower clock cycle if memory 20 fails at a faster clock cycle.

Figure 14:
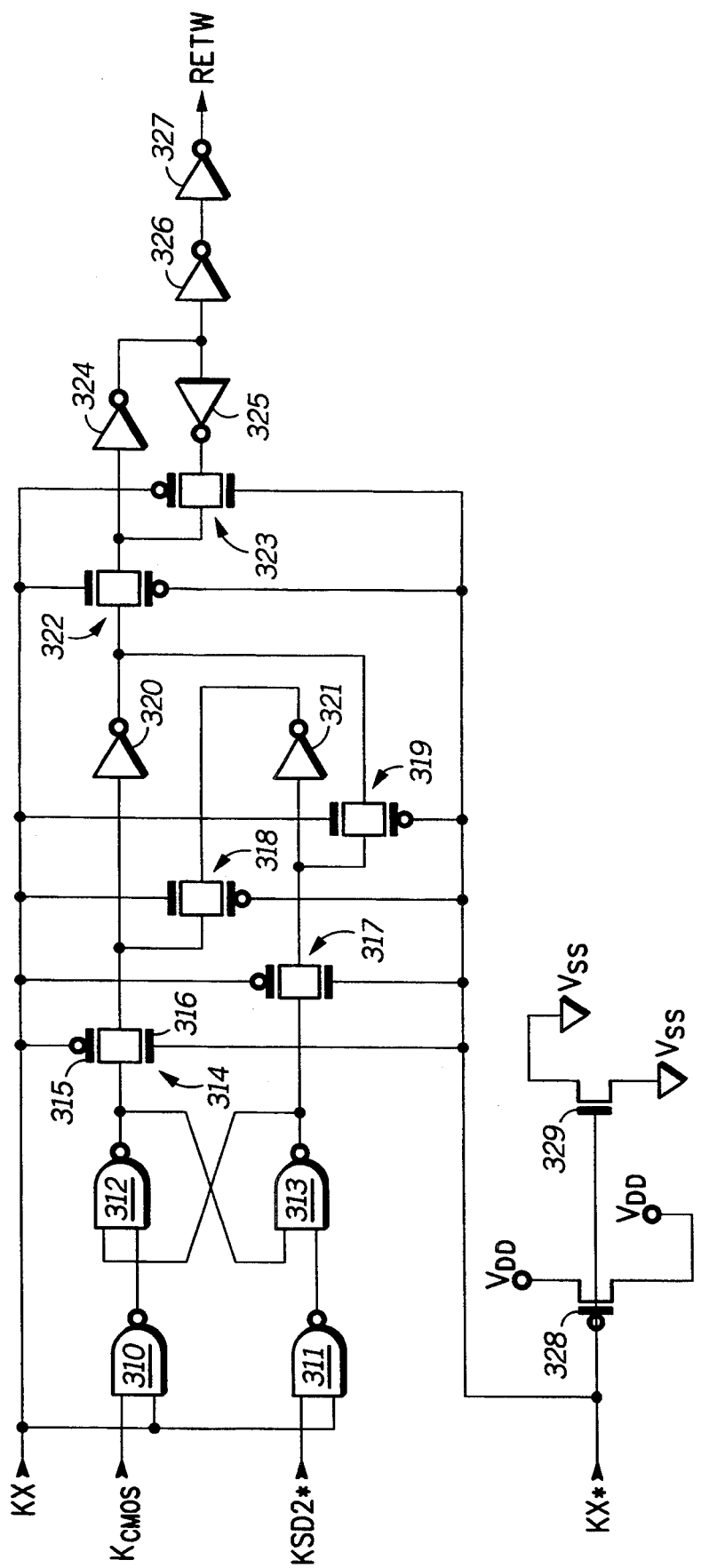
FIG. 14 illustrates in partial schematic diagram form and partial logic diagram form, the arbiter circuit of FIG. 12.

FIG. 14 illustrates in partial schematic diagram form and partial logic diagram form, arbiter circuit 264 of write control delay locked loop 52 of FIG. 12. Arbiter circuit 264 includes NAND logic gates 310, 311, 312, and 313, transmission gates 314, 317, 318, 319, 322, and 323, inverters 324, 325, 326, and 327, P-channel transistor 328, and N-channel transistor 329. Each transmission gate includes a P-channel transistor and an N-channel transistor. By way of example, transmission gate 314 includes a P-channel transistor 315 connected in parallel with an N-channel transistor 314. NAND logic gate 310 has a first input terminal for receiving clock signal K$_{CMOS}$, a second input terminal for receiving clock signal KX, and an output terminal. NAND logic gate 311 has a first input terminal for receiving clock signal KSD2*, a second input terminal for receiving clock signal KX, and an output terminal. NAND logic gate 312 has a first input terminal, a second input terminal connected to the output terminal of NAND logic gate 310, and an output terminal. NAND logic gate 313 has a first input terminal connected to the output terminal of NAND logic gate 312, and second input terminal connected to the output terminal of NAND logic gate 311, and an output terminal connected to the first input terminal of NAND logic gate 312. Transmission gate 314 has an input terminal connected to the output terminal of NAND logic gate 312, a first control terminal for receiving clock signal KX, a second control terminal for receiving clock signal KX*, and an output terminal. Transmission gate 317 has an input terminal connected to the output terminal of NAND logic gate 313, a first control terminal for receiving clock signal KX, a second control terminal for receiving clock signal KX*, and an output terminal. Inverter 320 has an input terminal connected to the output terminal of transmission gate 314, and an output terminal. Inverter 321 has an input terminal connected to the output terminal of transmission gate 317, and an output terminal. Transmission gate 318 has an input terminal connected to the output terminal of inverter 321, a first control terminal for receiving clock signal KX*, a second control terminal for receiving clock signal KX, and an output terminal connected to the input terminal of inverter 320. Transmission gate 319 has an input terminal connected to the output terminal of inverter 320, a first control terminal for receiving clock signal KX*, a second control terminal for receiving clock signal KX, and an output terminal connected to the input terminal of inverter 321. Transmission gate 322 has an input terminal connected to the output terminal of inverter 320, a first control terminal for receiving clock signal KX*, a second control terminal for receiving clock signal KX, and an output terminal. Inverter 324 has an input terminal connected to the output terminal of transmission gate 322, and an output terminal. Inverter 325 has an input terminal connected to the output terminal of inverter 324, and an output terminal. Transmission gate 323 has an input terminal connected to the output terminal of inverter 325, a first control terminal for receiving clock signal KX, a second control terminal for receiving clock signal KX*, and an output terminal connected to the input terminal of inverter 324. Inverter 326 has an input terminal connected to the output terminal of inverter 324, and an output terminal. Inverter 327 has an input terminal connected to the output terminal of inverter 326, and an output terminal for providing retard signal RETW. P-channel transistor 328 has a source and a drain both connected to $V_{DD}$, and a gate for receiving clock signal KX*. N-channel transistor 329 has both a drain and a source connected to $V_{SS}$, and a gate for receiving clock signal KX*.

Arbiter circuit 264 operates in a manner similar to that of arbiter circuit 86 of FIG. 8, except that arbiter circuit 264 is a CMOS implementation whereas arbiter circuit 86 is implemented using ECL. Clock signal KX has a frequency equal to one-half of the frequency of clock signal K$_{CMOS}$. Clock signal KX enables arbiter circuit 264 when clock signal KX is a logic high, and disables arbiter circuit 264 when it is a logic low. P-channel transistor 328 and N-channel transistor 329 are used to equalize the loading for differential clock signals KX and KX*.

Figure 15:
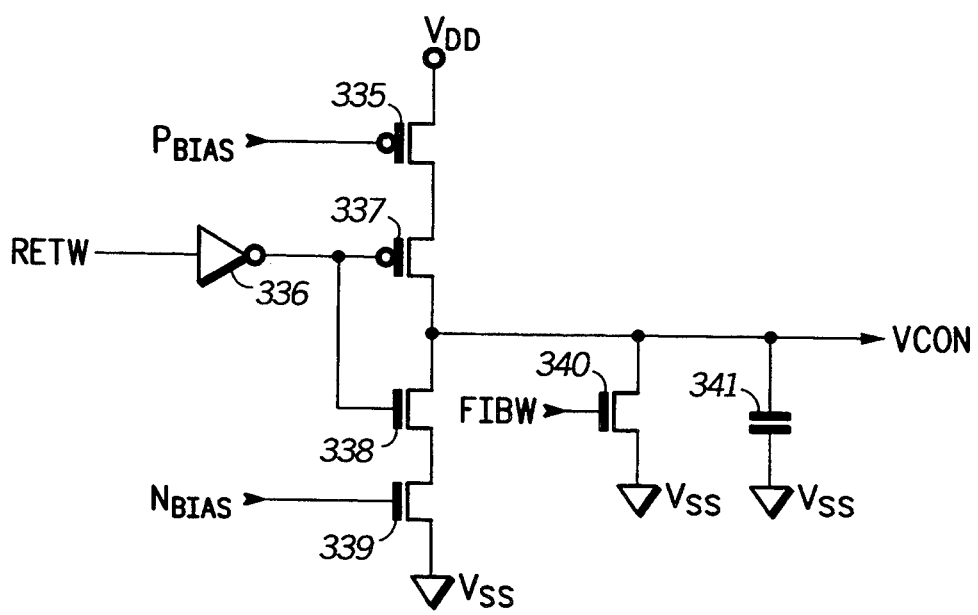
FIG. 15 illustrates in partial schematic diagram form and partial logic diagram form, the VCD control circuit of FIG. 12.

FIG. 15 illustrates in partial schematic diagram form and partial logic diagram form, VCD control circuit 265 of the write control delay locked loop 52 of FIG. 12. VCD control circuit 265 includes P-channel transistors 335 and 337, N-channel transistors 338, 339, and 340, inverter 336, and capacitor 341. P-channel transistor 335 has a source connected to $V_{DD}$, a gate for receiving bias voltage P$_{BIAS}$, and a drain. P-channel transistor 337 has a source connected to the drain of P-channel transistor 335, a gate, and a drain for providing control voltage VCON. Inverter 336 has an input terminal for receiving retard signal RETW, and an output terminal connected to the gate of P-channel transistor. N-channel transistor 338 has a drain connected to the drain of P-channel transistor 337, a gate connected to the gate of P-channel transistor 337, and a source. N-channel transistor 339 has a drain connected to the source of P-channel transistor 338, a gate for receiving bias voltage N$_{BIAS}$, and a source connected to $V_{SS}$. N-channel transistor 340 has a drain connected to the drain of P-channel transistor 337, a gate for receiving collapse detector output signal FIBW, and a source connected to $V_{SS}$. Capacitor 341 has a first plate electrode connected to the drain of P-channel transistor 337, and a second plate electrode connected to $V_{SS}$.

VCD control circuit 265 operates in a manner similar to VCD control circuit 87 of FIG. 10. When retard signal RETW is a logic high, control voltage VCON is increased by a relatively small amount, and when retard signal RETW is a logic low, control voltage VCON is reduced by a relatively small amount. Collapse detector output signal FIBW is a logic high when the delayed clock signals KSD/KSD* of FIG. 12 are not toggling. When collapse detector output signal FIBW is a logic high, control voltage VCON is reduced toward $V_{SS}$ at a relatively high rate until differential delayed clock signals KSD/KSD* start to toggle again.

Figure 16:
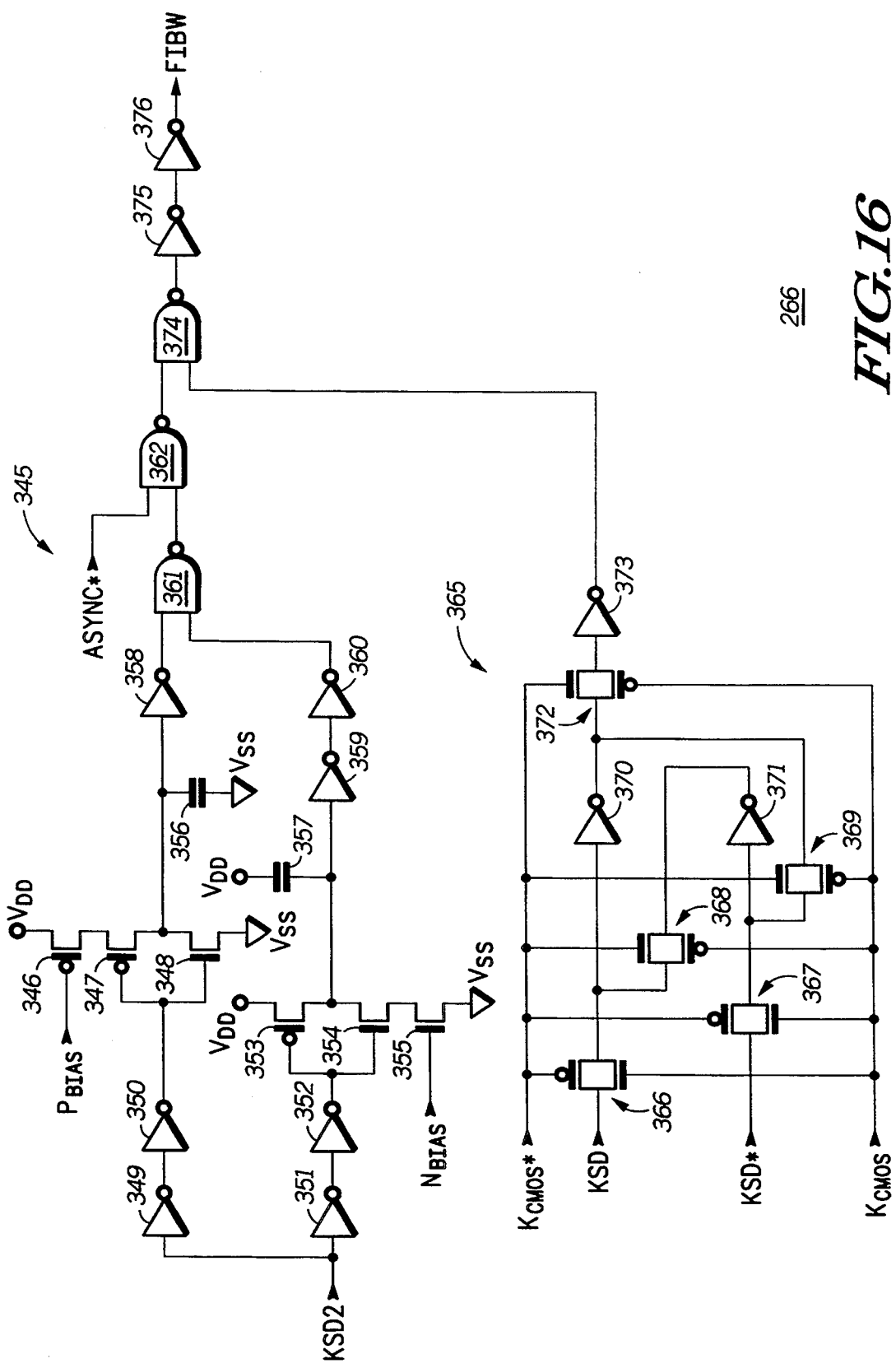
FIG. 16 illustrates in partial schematic diagram form and partial logic diagram form, the collapse detector circuit of FIG. 12.

FIG. 16 illustrates in partial schematic diagram form and partial logic diagram form, collapse detector circuit 266 of write control delay locked loop 52 of FIG. 12. Collapse detector circuit 266 detects a delay in a clock signal KSD that is greater than a predetermined time, and detects if clock signal KSD is greater than 180 degrees out-of-phase with clock signal K$_{CMOS}$. Collapse detector circuit 266 includes collapse detector portion 345, and 180 degree phase shift detector portion 365.

P-channel transistor 346 has a source connected to $V_{DD}$, a gate for receiving bias voltage $P_{BIAS}$, and a drain. P-channel transistor 347 has a source connected to the drain of P-channel transistor 346, a gate, and a drain. N-channel transistor 348 has a drain connected to the drain of P-channel transistor 347, a gate connected to the gate of P-channel transistor 347, and a source connected to $V_{SS}$. Inverter 349 has an input terminal for receiving clock signal KSD2, and an output terminal. Inverter 350 has an input terminal connected to the output terminal of inverter 349, and an output terminal connected to the gates of both of P-channel transistor 347 and N-channel transistor 348. Inverter 351 has an input terminal for receiving clock signal KSD2, and an output terminal. Inverter 352 has an input terminal connected to the output terminal of inverter 351, and an output terminal. P-channel transistor 353 has a source connected to $V_{DD}$, a gate connected to the output terminal of inverter 352, and a drain. N-channel transistor 354 has a drain connected to the drain of P-channel transistor 353, a gate connected to the gate of P-channel transistor 353, and a source. N-channel transistor 355 has a drain connected to the source of N-channel transistor 354, a gate for receiving bias voltage $N_{BIAS}$, and a source connected to $V_{SS}$. Capacitor 356 has a first plate electrode connected to the drain of P-channel transistor 347, and a second plate electrode connected to $V_{SS}$. Capacitor 357 has a first plate electrode connected to $V_{DD}$, and a second plate electrode connected to the drain of P-channel transistor 353. Inverter 358 has an input terminal connected to the drain of P-channel transistor 347, and an output terminal. Inverter 359 has an input terminal connected to the drain of P-channel transistor 353, and an output terminal. Inverter 360 has an input terminal connected to the output terminal of inverter 359, and an output terminal. NAND logic gate 361 has a first input terminal connected to the output terminal of inverter 358, a second input terminal connected to the output terminal of inverter 360, and an output terminal. NAND logic gate 362 has a first input terminal for receiving mode control signal ASYNC*, and second input terminal connected to the output terminal of NAND logic gate 361, and an output terminal. NAND logic gate 374 has a first input terminal connected to the output terminal of NAND logic gate 362, a second input terminal, and an output terminal. Inverter 375 has an input terminal connected to the output terminal of NAND logic gate 374, and an output terminal. Inverter 376 has an input terminal connected to the output terminal of inverter 375, and an output terminal for providing collapse detector output signal FIBW.

Transmission gate 366 has an input terminal for receiving clock signal KSD, a first control terminal for receiving clock signal $K_{CMOS}*$, a second control terminal for receiving clock signal $K_{CMOS}*$, and an output terminal. Transmission gate 367 has an input terminal for receiving clock signal KSD*, a first control terminal for receiving clock signal $K_{CMOS}*$, a second control terminal for receiving clock signal $K_{CMOS}$, and an output terminal. Transmission gate 368 has an input terminal, a first control terminal for receiving clock signal $K_{CMOS}$, a second control terminal for receiving clock signal $K_{CMOS}*$, and an output terminal connected to the output terminal of transmission gate 366. Transmission gate 369 has an input terminal, a first control terminal for receiving clock signal $K_{CMOS}$, a second control terminal for receiving clock signal $K_{CMOS}*$, and an output terminal connected to the output terminal of transmission gate 367. Inverter 370 has an input terminal connected to the output terminal of transmission gate 366, and an output terminal connected to the input terminal of transmission gate 369. Inverter 371 has an input terminal connected to the output terminal of transmission gate 367, and an output terminal connected to the input terminal of transmission gate 368. Transmission gate 372 has an input terminal connected to the output terminal of inverter 370, a first control terminal for receiving clock signal $K_{CMOS}$, a second control terminal for receiving clock signal $K_{CMOS}*$, and an output terminal. Inverter 373 has an input terminal connected to the output terminal of transmission gate 372, and an output terminal connected to the second input terminal of NAND logic gate 374.

Collapse detector circuit 266 operates in a manner similar to collapse detector circuit 88 of FIG. 11, except that collapse detector circuit 266 includes 180 degree phase shift detector portion 365. Since collapse detector circuit 266 receives CMOS level signals, there is no need for a level converter circuit as required with collapse detector circuit 88. Note that delayed clock signal KSD is generated from clock signal $K_{CMOS}$ as shown in FIG. 12.

One hundred and eighty degree phase shift detector portion 365 functions to detect whether or not delayed clock signal KSD is out of phase with clock signal $K_{CMOS}$ by more than 180 degrees. When clock signal KCMOS* is a logic low and clock signal KCMOS is a logic high, transmission gates 366 and 367 are conductive, which allows the state of delayed clock signals KSD and KSD* to propagate through. When clock signal KCMOS* rises and clock signal KCMOS falls, transmission gates 366 and 367 are substantially nonconductive, and the state of delayed clock signals KSD and KSD* are latched by transmission gates 368 and 369 and inverters 370 and 371. The latched logic state of delayed clock signals KSD/KSD* is then provided to NAND logic gate 374 through transmission gate 372. Thus, if delayed clock signal KSD is greater than 180 degrees out of phase with clock signal $K_{CMOS}$, then when clock signal $K_{CMOS}$ falls, the logic state of delayed clock signal KSD is at a logic low. If clock signal KSD is between 0 degree and 180 degrees out of phase with clock signal $K_{CMOS}$, then the logic state of clock signal KSD is at a logic high. In a preferred embodiment, delayed clock signal KSD will always be greater than zero degrees, because there is a minimum delay from clock signal $K_{CMOS}$ to delayed clock signal KSD. Once the logic state of delayed clock signal KSD is latched, 180 degree phase shift detector portion 365 can determine whether or not delayed clock signal KSD is out of phase with clock signal $K_{CMOS}$ by more than 180 degrees. If delayed clock signal KSD is out of phase with clock signal $K_{CMOS}$ by more than 180 degrees, then collapse detector signal FIBW is asserted as a logic high in order to reduce the propagation delay of delayed clock signal KSD. This prevents delay locked loop 52 from locking onto the wrong clock cycle, which may cause data to written to the wrong memory cell of memory array 22. If delayed clock signal KSD is within 180 degrees of clock signal $K_{CMOS}$, retard signal FIBW is a logic low, then N-channel transistor 340 (FIG. 15) is nonconductive and does not influence the value of control voltage VCON.

Mode control signal ASYNC* disables collapse detector circuit 266 when it is a logic low, indicating that memory 20 is operating in asynchronous mode.

Figure 17:
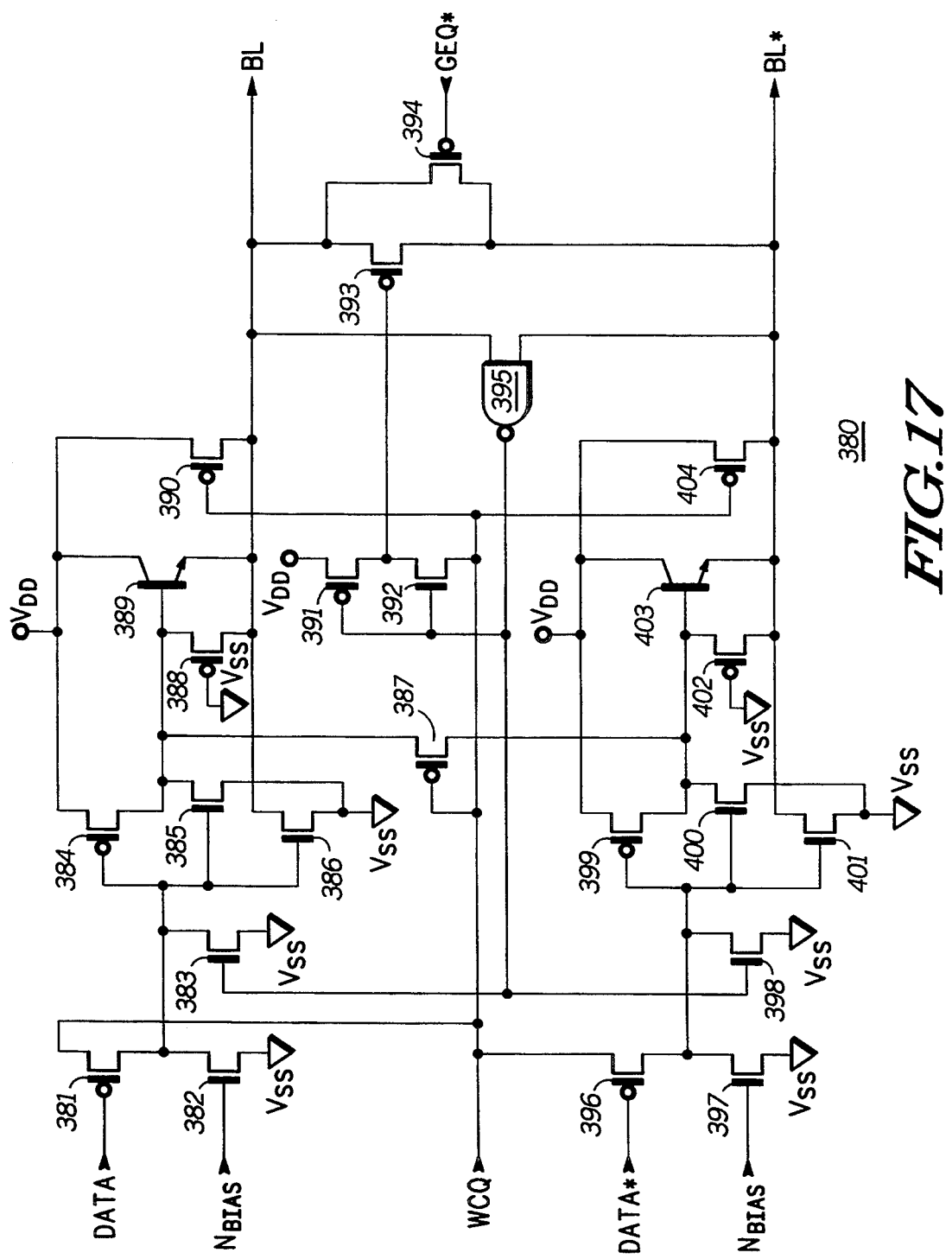
FIG. 17 illustrates in partial schematic diagram form and partial logic diagram form, the bit line load circuit of FIG. 1.

FIG. 17 illustrates in partial schematic diagram form and partial logic diagram form, bit line load 380, which is a portion of bit line loads/write drivers 30 of FIG. 1. Bit line load 380 includes P-channel transistors 381, 384, 387, 388, 390, 391, 393, 394, 396, 399, 402, and 404, N-channel transistors 382, 383, 385, 386, 392, 397, 398, 400, and 401, NPN transistors 389 and 403, and NAND logic gate 395.

P-channel transistor 381 has a first drain/source terminal for receiving write control signal WCQ, a gate for receiving data signal DATA, and a second drain/source terminal. N-channel transistor 382 has a drain connected to the second drain/source terminal of P-channel transistor 381, a gate for receiving bias voltage $N_{BIAS}$, and a source connected to $V_{SS}$. N-channel transistor 383 has a drain connected to the second drain/source terminal of P-channel transistor 381, a gate, and a source connected to $V_{SS}$. P-channel transistor 384 has a source connected to $V_{DD}$, a gate connected to the drain of N-channel transistor 383, and a drain. N-channel transistor 385 has a drain connected to the drain of P-channel transistor 384, a gate connected to the drain of N-channel transistor 383, and a source connected to $V_{SS}$. N-channel transistor 386 has a drain connected to bit line BL, a gate connected to the gate of N-channel transistor 385, and a source connected to $V_{SS}$. P-channel transistor 387 has a first drain/source terminal connected to the drain of N-channel transistor 385, a gate for receiving write control signal WCQ, and a second drain/source terminal. P-channel transistor 388 has a first drain/source terminal connected to the drain of N-channel transistor 385, a gate connected to $V_{SS}$, and a second drain/source terminal connected to bit line BL. NPN transistor 389 has a collector connected to $V_{DD}$, a base connected to the drain of N-channel transistor 385, and an emitter connected to bit line BL. P-channel transistor 390 has a source connected to $V_{DD}$, a gate for receiving write control signal WCQ, and a drain connected to bit line BL. P-channel transistor 391 has a source connected to $V_{DD}$, a gate, and a drain. N-channel transistor 392 has a drain connected to the drain of P-channel transistor 391, a gate connected to the gate of P-channel transistor 391, and a source for receiving write control signal WCQ. P-channel transistor 393 has a first drain/source terminal connected to bit line BL, a gate connected to the drain of P-channel transistor 391, and a second drain/source terminal connected to bit line BL*. P-channel transistor 394 has a first drain/source terminal connected to bit line BL, a gate for receiving a global equalization signal labeled "GEQ*", and a second drain/source terminal connected to bit line BL*. NAND logic gate 395 has a first input terminal connected to bit line BL, a second input terminal connected to bit line BL*, and an output terminal connected to the gate of N-channel transistor 383 and to the gates of both P-channel transistor 391 and N-channel transistor 392. P-channel transistor 396 has a first drain/source terminal for receiving write control signal WCQ, a gate for receiving data signal DATA*, and a second drain/source terminal. N-channel transistor 397 has a drain connected to the second drain/source terminal of P-channel transistor 396, a gate for receiving bias voltage $N_{BIAS}$, and a source connected to $V_{SS}$. N-channel transistor 398 has a drain connected to the drain of N-channel transistor 397, a gate connected to the output terminal of NAND logic gate 395, and a source connected to $V_{SS}$. P-channel transistor 399 has a source connected to $V_{DD}$, a gate connected to the drain of N-channel transistor 397, and a source connected to the second drain/source terminal of P-channel transistor 387. N-channel transistor 400 has a drain connected to the drain of P-channel transistor 399, a gate connected to the gate of P-channel transistor 399, and a source connected to $V_{SS}$. N-channel transistor 401 has a drain connected to bit line BL*, a gate connected to the gate of P-channel transistor 399, and a source connected to $V_{SS}$. P-channel transistor 402 has a first drain/source terminal connected to the drain of P-channel transistor 399, a gate connected to $V_{SS}$, and a second drain/source terminal connected to bit line BL*. NPN transistor 403 has a collector connected to $V_{DD}$, a base connected to the drain of N-channel transistor 400, and an emitter connected to bit line BL*. P-channel transistor 404 has a source connected to $V_{DD}$, a gate for receiving write control signal WCQ, and a source connected to bit line BL*.

During a read cycle of memory 20, write control signal WCQ is a logic low, which causes P-channel load transistors 390 and 404 to be conductive. P-channel load transistors 390 and 404 pull up bit lines BL and BL* toward $V_{DD}$, and act as load devices for the memory cells of memory array 22. Global equalization signal GEQ* is a logic high, causing P-channel transistor 394 to be substantially non-conductive. When a write operation is to be performed, differential data signals DATA and DATA* are first set to a logic state corresponding to data that is to be written into a selected memory cell, and then write control signal WCQ is provided as a logic high, which allows data signal DATA/DATA* to be provided to the gates of P-channel transistors 384 and 399. A logic high signal is transferred through either of P-channel transistors 381 or 396, depending on which of data signals DATA or DATA* is a logic low. The logic high signal proceeds to either turn off P-channel transistor 384 or turn on N-channel transistor 386, which will pull bit line BL low, or turn off P-channel transistor 399 and turn on N-channel transistor 401, in which case, bit line BL* is pulled low. The low value is transferred to the selected memory cell of memory array 22. When one of bit lines BL or BL* is pulled low, the output terminal of NAND logic gate 395 is provided as a logic high, which turns on N-channel transistors 383, and 398.

When write control signal WCQ returns to a logic low, signaling the end of the write cycle, the drain of either N-channel transistor 383 or 398, which ever was a logic high during the write cycle, is discharged, turning on either P-channel transistors 384 or 399, and either of NPN transistors 389 or 403. This returns the low bit line to a logic high. Also, P-channel transistor 387 is turned on to help short the bases of bipolar transistors 403 and 389, to achieve better equalization on bit lines BL and BL*. In addition, the logic low write control signal WCQ turns on P-channel transistors 390 and 404, which helps to pull, or precharge bit lines BL and BL* back to a logic high. The logic high output terminal of NAND logic gate 395 which results when either of BL or BL* is a logic low, turns on N-channel transistor 392 which pulls the gate of P-channel transistor 393 low, causing P-channel transistor 393 to be conductive. P-channel transistor 393 equalizes the differential voltage on bit lines BL and BL*. The output terminal of NAND logic gate 395 returns to a logic low when the differential voltage on bit lines BL and BL* is equalized. By sensing the state of the bit line pairs, and automatically beginning the precharge and equalization of the bit line pairs that have been written to or read from, the bit line pairs can be rapidly readied for the next read cycle.

Global equalization signal GEQ* is generated at the end of the write cycle to equalize all columns in the block of memory array 22 that was being written to. This signal equalizes a differential voltage on bit line pairs that was caused by noise generated from writing to adjacent bit line pairs.

By having the sources of pull down N-channel transistors 383 and 398 connected directly to $V_{SS}$, bit line load circuit 380 allows write cycles of memory 20 to occur quickly. Also, the bit-line pairs can be precharged quickly by using NPN transistors 389 and 403 rather than using MOS transistors which generally do not have as much drive capability. Additionally, by sensing the state of bit lines BL and BL* to automatically equalize the bit line pairs after a read cycle, write recovery occurs with minimum delay.

FIG. 18 illustrates a timing diagram of various signals of memory 20 of FIG. 1 during three stage pipeline mode. Note that the timing diagram of FIG. 18 is not drawn to scale. A rising edge of clock signal CLK generates data signal MUX. A falling edge of clock signal CLK generates clock signal MD90. After the internal memory propagation delay, data signal MUX changes state, and after a delay through dummy path 46 (FIG. 4), clock signal MD90 changes state. Clock signal MD90 changes state at the midpoint of the data valid time of data signal MUX. Data signal MUX becomes data signal MUX1 when clock signal MD90 is a logic high. Data signal MUX2 is provided when clock signal MD90 is a logic low. The clock signal KU then acquires data signals MUX1 and MUX2 provides them to the output as data signal QPAD. Since data signals MUX1 and MUX2 are changing at about one-half the frequency of data signal MUX, delayed clock signal KU has a wider window of validity from which to acquire data signals MUX1 and MUX2. In three stage pipeline mode, data corresponding to address A0 at cycle "0" is valid output data at cycle "3", thus providing a three stage pipeline. Dummy output signal QDUM is generated from delayed clock signal KU and tracks the delay of delayed clock signal KU to control the delay of delayed clock signal KU. Unlike data signal QPAD, dummy output signal QDUM changes states during each cycle of delayed clock signal KU. Data signal QPAD is not used by arbiter circuit 86 because it is not required to change on every clock cycle.

FIG. 19 illustrates a timing diagram of various signals of memory 20 of FIG. 1 in two stage pipeline mode. Note that the timing diagram of FIG. 18 is not drawn to scale. In two stage pipeline mode, data corresponding to address A0 is acquired at cycle "0" and is provided as valid output data at cycle "2", thus providing a two stage pipeline. As mentioned above in reference to FIG. 2, this is accomplished by inverting the internal state of delayed clock signal KU, so that data signals MUX1 and MUX2 are acquired on the opposite edges of KU, thus providing the data signals to the output of memory 20 after two cycles. As can be seen from FIG. 19, this allows the frequency of clock signal CLK to be lower as compared to the three stage pipeline mode before clock signal KU will acquire wrong data, thus increasing the maximum restriction on clock cycle time.

Figure 20:
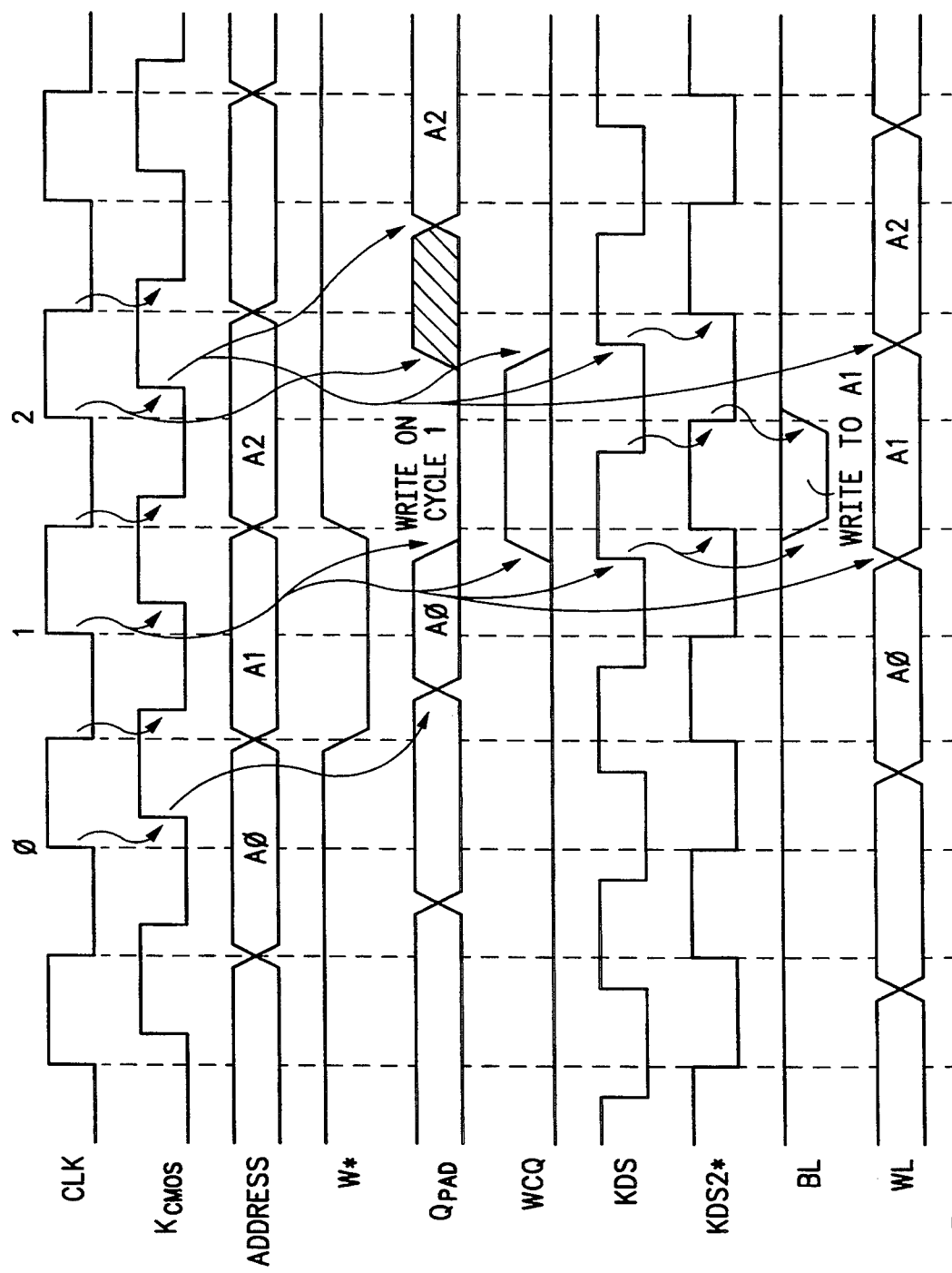
FIG. 20 illustrates a timing diagram of various signals of the memory of FIG. 1 in asynchronous mode during read and write cycles.

FIG. 20 illustrates a timing diagram of various signals of memory 20 of FIG. 1 in asynchronous mode during both read and write cycles. Note that the timing diagram of FIG. 18 is not drawn to scale. In asynchronous mode, data signal QPAD is valid as soon as possible after the rising edge of clock signal CLK. This is because output registers 34 are in a flow through mode. During a write cycle, output enable registers 48 are also in a flow through mode, so the output of memory 20 becomes a logic low relatively quickly after write enable signal W* is provided as a logic low. Also, during a write cycle, delayed clock signal KSD is provided after the maximum propagation delay, which results in relatively large margins on the write address setup time, write pulse width time, and write address hold time. Note that the width of write control signal WCQ is equal to about one-half of a cycle of clock signal CLK.

The use of parallel data paths increases the data valid time at the data output of memory 20. FIG. 18 illustrates that the data valid time of data signals MUX1 and MUX2 are greater than the data valid time of data signal MUX, since data signals MUX1 and MUX2 change only half as often as data signal MUX. Also, clock signal MD90 is correlated to the internal memory delay by dummy path 46, and tracks data signal MUX in terms of process, power supply, and temperature variations. In addition, if the frequency of clock signal CLK decreases, clock signal MD90 remains at the midpoint of the data valid time, and the data valid window increases. It is therefore much easier for the delayed clock signal KU to acquire output data and cause the output data to be provided to the output data pad (not shown) at the required time.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A pipelined integrated circuit memory, comprising:
    a plurality of memory cells, each memory cell of the plurality of memory cells coupled to a bit line pair and to a word line;
    a column decoding circuit, coupled to the plurality of memory cells, for providing a data signal corresponding to data stored in a selected memory cell during a read cycle of the memory;
    an output register, having an input terminal coupled to the column decoding circuit, and an output terminal, the output register for receiving the data signal from the column decoding circuit, the output register responsive to a first clock signal; and
    an output enable circuit, coupled to the output register, for delaying the data signal for three clock cycles of the first clock signal during operation of the pipelined integrated circuit in a three-stage pipelining mode, and for delaying the output data for two clock cycles of the first clock signal during operation of the pipelined integrated circuit memory in a two-stage pipelining mode.

2. The pipelined integrated circuit memory of claim 1, wherein the output enable circuit comprises a plurality of series connected registers for receiving a write control signal, a second clock signal, and a pipelining control signal, and for providing an output enable signal on a third clock cycle of the second clock signal after the plurality of series connected registers has received the write control signal while operating in the three-stage pipelining mode, and for providing the output enable signal on a second clock cycle of the second clock signal while operating in the two-stage pipelining mode.

3. The pipelined integrated circuit memory of claim 2, wherein the first clock signal has a frequency equal to about one half a frequency of the second clock signal.

4. The pipelined integrated circuit memory of claim 1, further comprising a switch having an input terminal for receiving the data signal from the column decoding circuit, a control terminal for receiving the output enable signal, and an output terminal coupled to the input terminal of the output register.

5. The pipelined integrated circuit memory of claim 1, further comprising an amplifier circuit having an input terminal coupled to the output terminal of the output register, a control terminal for receiving the first clock signal, and an output terminal for providing an output data signal corresponding to the data signal.

6. The pipelined integrated circuit memory of claim 5, wherein the output data signal is characterized as being an ECL (emitter-coupled logic) level signal.

7. The pipelined integrated circuit memory claim 1, further comprising an asynchronous operating mode, wherein the output register provides the data signal on a next clock cycle of the first clock signal after an asynchronous mode control signal is asserted.

8. The pipelined integrated circuit memory of claim 1, wherein the plurality of memory cells are static random access memory cells.

9. A pipelined memory having synchronous and asynchronous operating modes, comprising:

a plurality of memory cells, each memory cell of the plurality of memory cells coupled to a bit line pair and to a word line;

a column decoding circuit, coupled to the plurality of memory cells, for providing a data signal corresponding to data stored in a selected memory cell during a read cycle of the memory;

an output register, having an input terminal coupled to the column decoding circuit, and an output terminal, the output register for receiving the data signal from the column decoding circuit, the output register responsive to a first clock signal; and a plurality of output enable registers, coupled to the output register, for delaying the data signal for three clock cycles of the first clock signal during operation of the pipelined integrated circuit in a three-stage pipelining mode, for delaying the output data for two clock cycles of the first clock signal during operation of the pipelined integrated circuit memory in a two-stage pipelining mode, and for delaying the output data for one clock cycle of the first clock signal during operation of the pipelined integrated circuit memory in the asynchronous operating mode.

10. The pipelined memory of claim 9, wherein the plurality of memory cells are static random access memory cells.

11. The pipelined memory of claim 9, wherein the plurality of output enable registers comprises a plurality of series connected registers for receiving a write control signal, a second clock signal, and a pipelining control signal, and for providing an output enable signal on a third clock cycle of the second clock signal after the plurality of series connected registers has received the write control signal while operating in the three-stage pipelining mode, for providing the output enable signal on a second clock cycle of the second clock signal while operating in the two-stage pipelining mode, and for providing the output enable signal of a first clock cycle of the second clock signal while operating in the asynchronous operating mode.

12. The pipelined memory of claim 11, wherein the first clock signal has a frequency equal to about one half a frequency of the second clock signal.

13. The pipelined memory of claim 9, further comprising an amplifier circuit having an input terminal coupled to the output terminal of the output register, a control terminal for receiving the first clock signal, and an output terminal for providing an output data signal corresponding to the data signal.

14. The pipelined memory of claim 13, wherein the output data signal is characterized as being an ECL (emitter-coupled logic) level signal.

15. A pipelined static random access memory having synchronous and asynchronous operating modes, comprising:

a plurality of memory cells, each memory cell of the plurality of memory cells coupled to a bit line pair and to a word line;

a column decoding circuit, coupled to the plurality of memory cells, for providing a data signal corresponding to data stored in a selected memory cell during a read cycle of the memory;

an output register, having an input terminal coupled to the column decoding circuit, and an output terminal, the output register for receiving the data signal from the column decoding circuit, the output register responsive to a first clock signal;

a plurality of series connected output enable registers, coupled to the output register, for delaying the data signal for three clock cycles of the first clock signal during operation of the pipelined integrated circuit in a three-stage pipelining mode, for delaying the output data for two clock cycles of the first clock signal during operation of the pipelined integrated circuit memory in a two-stage pipelining mode, and for delaying the output data for one clock cycle of the first clock signal during operation of the pipelined integrated circuit memory in the asynchronous operating mode; and a switch having an input terminal for receiving the data signal from the column decoding circuit, a control terminal for receiving the output enable signal, and an output terminal coupled to the input terminal of the output register.

16. The pipelined static random access memory of claim 15, wherein the plurality of series connected output enable registers are for receiving a write control signal, a second clock signal, and a pipelining control signal, and for providing an output enable signal on a third clock cycle of the second clock signal after the plurality of series connected registers has received the write control signal while operating in the three-stage pipelining mode, for providing the output enable signal on a second clock cycle of the second clock signal while operating in the two-stage pipelining mode, and for providing the output enable signal of a first clock cycle of the second clock signal while operating in the asynchronous operating mode.

17. The pipelined static random access memory of claim 16, wherein the plurality of series connected output enable registers comprises:

a first register having an input terminal for receiving the write control signal, a control terminal for receiving the second clock signal, and an output terminal;

a second register having an input terminal coupled to the output terminal of the first register, a control terminal for receiving the second clock signal, and an output terminal;

a third register having an input terminal coupled to the output terminal of the second register, a first control terminal for receiving the second clock signal, a second control terminal for receiving mode control signal, and an output terminal;

a fourth register having an input terminal coupled to the output terminal of the third register, a first control terminal for receiving the second clock signal, a second control terminal for receiving the control signal, and an output terminal;

a fifth register having an input terminal coupled to the output terminal of the fourth register, a first control terminal for receiving the second clock signal, a second control terminal for receiving the asynchronous mode control signal, and an output terminal; and a sixth register having an input terminal coupled to the output terminal of the fifth register, a first control terminal for receiving the second clock signal, a second control terminal for receiving the asynchronous mode control signal, and an output terminal for providing the output enable signal.

18. The pipelined static random access memory of claim 17 wherein the first clock signal has a frequency equal to about one half a frequency of the second clock signal.

19. The pipelined memory of claim 18, further comprising an amplifier circuit having an input terminal coupled to the output terminal of the output register, a control terminal for receiving the first clock signal, and an output terminal for providing an output data signal corresponding to the data signal.

20. The pipelined memory of claim 19, wherein the output data signal is characterized as being an ECL (emitter-coupled logic) level signal.

* * * * *